(12) United States Patent
Yui

(10) Patent No.: US 7,224,753 B2
(45) Date of Patent: May 29, 2007

(54) M-ARY-MODULATION-CAPABLE EQUALIZING PROCESSING APPARATUS, RECEIVED SIGNAL PROCESSING SYSTEM, RECEIVER AND M-ARY-MODULATION-CAPABLE EQUALIZING PROCESSING METHOD

(75) Inventor: Tomohiro Yui, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 239 days.

(21) Appl. No.: 11/136,605

(22) Filed: May 25, 2005

(65) Prior Publication Data

US 2005/0265495 A1    Dec. 1, 2005

(30) Foreign Application Priority Data

May 27, 2004   (JP)   ............................. 2004-157751

(51) Int. Cl.
*H04L 27/06* (2006.01)
*H03M 13/03* (2006.01)

(52) U.S. Cl. ...................... 375/341; 714/795

(58) Field of Classification Search ............... 375/316, 375/341, 340, 262, 265; 714/786, 794, 795
See application file for complete search history.

(56) References Cited

U.S. PATENT DOCUMENTS 5,920,599 A * 7/1999 Igarashi ..................... 375/341

FOREIGN PATENT DOCUMENTS

JP            05335893        12/1993

* cited by examiner

*Primary Examiner*—Tesfaldet Bocure
(74) *Attorney, Agent, or Firm*—Stevens, Davis, Miller & Mosher, LLP

(57) ABSTRACT

An M-ary-modulation-capable equalizing processing apparatus, received signal processing system, receiver and M-ary-modulation-capable equalizing processing method enabling reduction in processing amount of the equalizing processing while improving bit error rate characteristics. M-ary-modulation-capable equalizing processing apparatus 6 has phase rotation sections 601 to 604, equalizing processing sections 611 to 614 and soft-decision value determining section 620. Phase rotation sections 601 to 604 rotate phases of signal Sr1 to Sr4. The signals Sr1 to Sr4 are obtained from a received signal Sr that is converted into a digital baseband signal and that has information amounts "3" per symbol, and have an information amount of 1 bit per symbol. Equalizing processing sections 611 to 614 perform equalizing the processing on the signals Sr1 to Sr4 to output soft decision value Spd1 to Spd4. Based on the soft decision value Spd1 to Spd4, soft-decision value determining section 620 determines a soft decision value Ssd.

12 Claims, 11 Drawing Sheets

M-ARY-MODULATION-CAPABLE EQUALIZING PROCESSING APPARATUS, RECEIVED SIGNAL PROCESSING SYSTEM, RECEIVER AND M-ARY-MODULATION-CAPABLE EQUALIZING PROCESSING METHOD

BACKGROUND OF THE INVENTION

1. Field of the Invention

The present invention relates to an M-ary-modulation-capable equalizing processing apparatus, received signal processing system, receiver and M-ary-modulation-capable equalizing processing method, and more particularly, to an M-ary-modulation-capable equalizing processing apparatus for use in digital radio communication techniques to support fading, received signal processing system including the M-ary-modulation-capable equalizing processing apparatus, receiver including the received signal processing system, and M-ary-modulation-capable equalizing processing method to achieve aforementioned apparatuses and system.

2. Description of Related Art

Generally, on radio channels a receiver receives at the same time radio signals propagated through a plurality of paths with different propagation time due to effects of multipath fading. Therefore, on the receiver, delay distortion occurs and bit error rate characteristic deteriorate.

As the symbol rate is increased, the delay distortion becomes larger. Accordingly, in future high-rate digital mobile communication apparatuses, effects of delay distortion are not ignored, and it is dispensable removing the delay distortion.

An equalizer is representative means for correcting the delay distortion. In the radio communication field, an equalizer is mounted on a receiver that performs high-rate transmission. Further, there is a growing trend to mount an equalizer on mobile phones and the like that adopt GSM (Global System for Mobile communication) that is one of European digital mobile telephone standards.

A representative algorithm as an equalizer is a Viterbi equalizing algorithm. The Viterbi equalizing algorithm is one for generating a received signal replica from combinations of all expected received signals using detection results of delay distortion of multipath fading, and estimating a most likely transmitted signal from the Euclidean distance between the replica and received signal.

A processing amount of the Viterbi equalizing algorithm is affected by "$2^{at}$" when assumed that allowed delay time on multipath fading is t[s] ($t=k \times T$, where T is a symbol duration, and k is the number of allowable delay taps) and an information amount per symbol is a bits. This is because of increases in the number of states in trellis state transition and the number of possible transitions from state "1" used in the Viterbi equalizing algorithm, and the processing amount exponentially increases with increases in information amount a per symbol.

For example, in EDGE (Enhanced Data GSM Environment) that is the GSM next-generation communication standard, the information amount per symbol is "3" (the information amount a is "1" in GSM), and when the number of allowable delay taps (k) is "5", required are the number of states of "4096" and the number of possible transitions of "8". The number of states in EDGE is 256 times that in GSM, and the number of possible transitions in EDGE is 3 times that in GSM.

Document 1 (Japanese Laid-Open Patent Publication H05-335893) discloses an equalizing method and apparatus which define a plurality of states as one state set in the Viterbi equalizing algorithm, applying the Viterbi equalizing algorithm to such a limited state of the state set, and thereby suppressing the processing amount of the Viterbi equalizing amount.

However, in the equalizing method and apparatus as disclosed in Patent Document 1, considered are transitions for each state set and transitions between limited states in the Viterbi equalizing algorithm, and consideration is not given to deterioration of bit error rate characteristics.

SUMMARY OF THE INVENTION

It is an object of the present invention to provide an M-ary-modulation-capable equalizing processing apparatus, received signal processing system, receiver and M-ary-modulation-capable equalizing processing method enabling reduction in processing amount of the equalizing processing while improving bit error rate characteristics.

According to an aspect of the invention, an M-ary-modulation-capable equalizing processing apparatus has a signal divider that divides a received signal that has a plurality of information amounts a (a is a natural number) per symbol and that is converted into a digital baseband signal into a first signal to $2^{a-1}$th signal each having information of one bit per symbol, first phase rotator to $2^{a-1}$th phase rotator which respectively rotate phases of the first signal to $2^{a-1}$th signal by $(\pi/2^a + (S(S=1\sim 2^{a-1})-1)\pi/2^{a-1})$, first equalizing processor to $2^{a-1}$th equalizing processor which perform equalizing processing based on the Viterbi equalizing algorithm respectively based on phase-rotated first signal to $2^{a-1}$th signal and a channel impulse response signal, and output a first provisional soft decision value to $2^{a-1}$th provisional soft decision value, respectively, and a soft-decision value determiner that makes a soft decision on whether each of the first provisional soft decision value to $2^{a-1}$th provisional soft decision value belongs to a symbol in a range of $S-2$ to $S-2+2^{a-1}-1$.

According to another aspect of the invention, an M-ary-modulation-capable equalizing processing apparatus has a received signal storage which stores a received signal that has a plurality of information amounts a (a is a natural number) per symbol and that is converted into a digital baseband signal, and divides the stored received signal into a first signal to $2^{a-1}$th signal each having information of one bit per symbol to read sequentially based on a read control signal, a phase rotator that rotates a phase of each of the first signal to $2^{a-1}$th signal sequentially based on a phase rotation angle signal, an equalizing processor which performs equalizing processing based on the Viterbi equalizing algorithm sequentially based on each of phase-rotated first signal to $2^{a-1}$th signal, a channel impulse response signal and an equalizing processing control signal, and outputs a first provisional soft decision value to $2^{a-1}$th provisional soft decision value, first provisional soft decision value storage to $2^{a-1}$th provisional soft decision value storage which respectively store the first provisional soft decision value to $2^{a-1}$th provisional soft decision value based on a storage control signal, a soft-decision value determiner that makes a soft decision on whether each of the first provisional soft decision value to $2^{a-1}$th provisional soft decision value belongs to a symbol in a range of S ($S=1\sim 2^{a-1}$)$-2$ to $S-2+2^{a-1}-1$ based on a soft-decision value determination control signal, and a controller which outputs the read control signal, phase rotation angle signal, the equalizing processing control signal, the storage control signal and the soft-decision value determination control signal.

According to another aspect of the invention, an M-ary-modulation-capable equalizing processing apparatus has first phase rotator to $2^{a-1}$th phase rotator which receive a received signal that has a plurality of information amounts a per symbol and that is converted into a digital baseband signal as a first signal to $2^{a-1}$th signal each having information of one bit per symbol, and respectively rotate phases of the first signal to $2^{a-1}$th signal by $(\pi/2^a+(S(S=1\sim2^{a-1})-1)\pi/2^{a-1})$ based on a phase rotation angle signal, first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively, a soft-decision value determiner that makes a soft decision on whether each of the first provisional soft decision value to $2^{a-1}$th provisional soft decision value belongs to a symbol in a range of S–2 to S–2+$2^{a-1}$–1 based on a soft-decision value determination control signal, and a controller which outputs the phase rotation angle signal, the equalizing processing control signal, and the soft-decision value determination control signal.

According to another aspect of the invention, a received signal processing system has an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with a signal divider that divides a received signal that has a plurality of information amounts a (a is a natural number) per symbol and that is converted into a digital baseband signal into a first signal to $2^{a-1}$th signal each having information of one bit per symbol, first phase rotator to $2^{a-1}$th phase rotator which respectively rotate phases of the first signal to $2^{a-1}$th signal by $(\pi/2^a+(S(S=1\sim2^{a-1})-1)\pi/2^{a-1})$, first equalizing processor to $2^{a-1}$th equalizing processor which perform equalizing processing based on the Viterbi equalizing algorithm based on phase-rotated first signal to $2^{a-1}$th signal and a channel impulse response signal, and output a first provisional soft decision value to $2^{a-1}$th provisional soft decision value, respectively, and a soft-decision value determiner that makes a soft decision on whether each of the first provisional soft decision value to $2^{a-1}$th provisional soft decision value belongs to a symbol in a range of S–2 to S–2+$2^{a-1}$–1.

According to another aspect of the invention, a received signal processing system has an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with a received signal storage which stores a received signal that has a plurality of information amounts a (a is a natural number) per symbol and that is converted into a digital baseband signal, and divides the stored received signal into a first signal to $2^{a-1}$th signal each having information of one bit per symbol to read sequentially based on a read control signal, a phase rotator which rotates a phase of each of the first signal to $2^{a-1}$th signal based on a phase rotation angle signal, an equalizing processor which performs equalizing processing based on the Viterbi equalizing algorithm based on each of phase-rotated first signal to $2^{a-1}$th signal, a channel impulse response signal and an equalizing processing control signal, and outputs a first provisional soft decision value to $2^{a-1}$th provisional soft decision value, first provisional soft decision value storage to $2^{a-1}$th provisional soft decision value storage which respectively store the first provisional soft decision value to $2^{a-1}$th provisional soft decision value based on a storage control signal, a soft-decision value determiner that makes a soft decision on whether each of the first provisional soft decision value to $2^{a-1}$th provisional soft decision value belongs to a symbol in a range of S–2 to S–2+$2^{a-1}$–1 based on a soft-decision value determination control signal, and a controller which outputs the read control signal, the phase rotation angle signal, the equalizing processing control signal, the storage control signal and the soft-decision value determination control signal.

According to another aspect of the invention, a received signal processing system has an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with first phase rotator to $2^{a-1}$th phase rotator which receive a received signal that has a plurality of information amounts a (a is a natural number) per symbol and that is converted into a digital baseband signal as a first signal to $2^{a-1}$th signal each having information of one bit per symbol, and respectively rotate phases of the first signal to $2^{a-1}$th signal by $(\pi/2^a+(S(S=1\sim2^{a-1})-1)\pi/2^{a-1})$ based on a phase rotation angle signal, first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively, a soft-decision value determiner that makes a soft decision on whether each of the first provisional soft decision value to $2^{a-1}$th provisional soft decision value belongs to a symbol in a range of S–2 to S–2+$2^{a-1}$–1 based on a soft-decision value determination control signal, and a controller which outputs the phase rotation angle signal, the equalizing processing control signal, and the soft-decision value determination control signal.

According to another aspect of the invention, a receiver has the received signal processing system and further has a reception antenna that receives the high-frequency received signal and a speaker that outputs speech based on speech data from the speech codec section.

According to still another aspect of the invention, an M-ary-modulation-capable equalizing processing method has the steps of dividing a received signal that has a plurality of information amounts a (a is a natural number) per symbol and that is converted into a digital baseband signal into a first signal to $2^{a-1}$th signal each having information of one bit per symbol, rotating each of phases of the first signal to $2^{a-1}$th signal by $(\pi/2^a+(S(S=1\sim2^{a-1})-1)\pi/2^{a-1})$ performing equalizing processing based on the Viterbi equalizing algorithm based on each of phase-rotated first signal to $2^{a-1}$th signal and a channel impulse response signal and generating a first provisional soft decision value to $2^{a-1}$th provisional soft decision value, and making a soft decision on whether each of the first provisional soft decision value to $2^{a-1}$th provisional soft decision value belongs to a symbol in a range of S−2 to S−2+$2^{a-1}$−1.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which; (40)

DESCRIPTION OF THE PREFERRED EMBODIMENTS

It is a gist of the invention generating first signal to $2^{a-1}$th signal each having information of one bit per symbol from a received signal that is converted into a digital baseband signal and that has information amounts a per symbol, rotating phases of the first signal to $2^{a-1}$th signal by $(\pi/2^a+(S-1)\pi/2^{a-1})$, making a soft decision on whether each of the phase-rotated first signal to $2^{a-1}$th signal belongs to a symbol in a range of S−2 to S−2+$2^{a-1}$, and determining a soft-decision value of each bit from the first provisional soft decision value to $2^{a-1}$th provisional soft decision value.

Embodiments of the invention will specifically be described below with reference to accompanying drawings.

Embodiment 1

Embodiment 1 and Embodiments 2 to 5 described later of the invention explain a receiver, received signal processing system, M-ary-modulation-capable equalizing processing apparatus, and M-ary-modulation-capable equalizing processing method using an 8PSK modulation scheme as a modulation scheme.

[Configuration of a Receiver and Received Signal Processing System]

Figure 2:
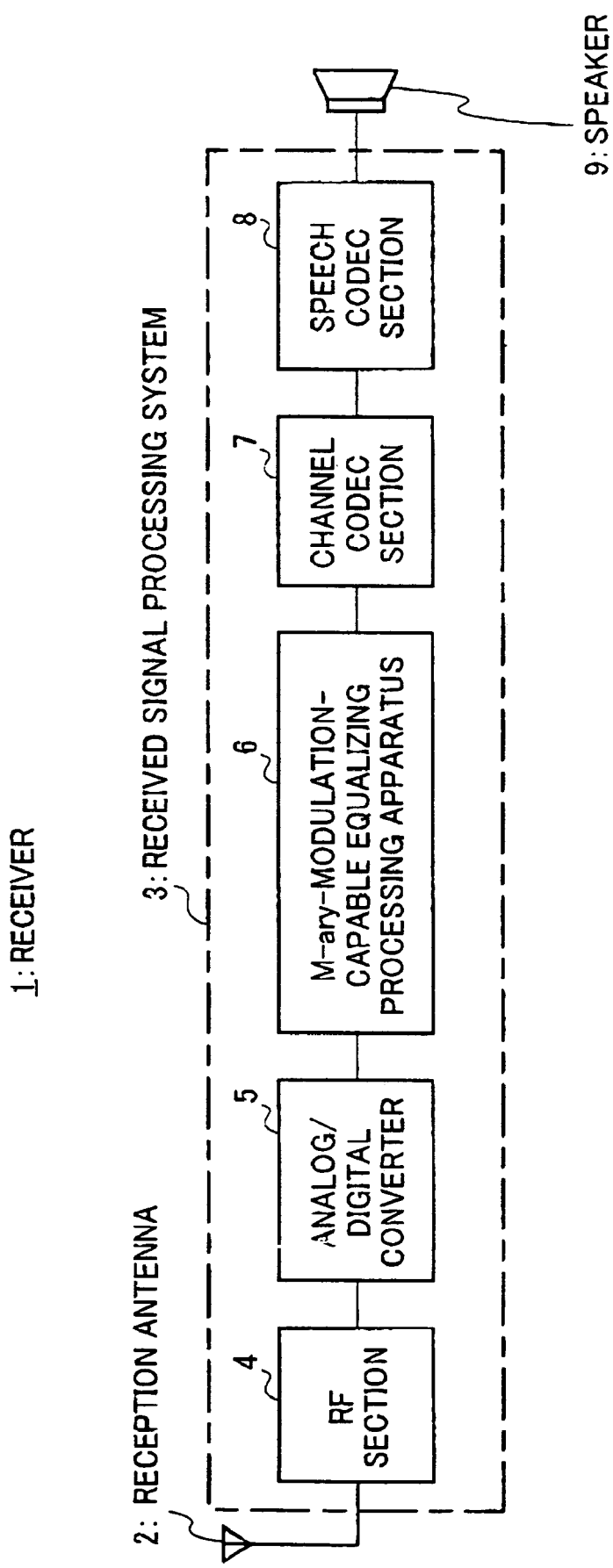
FIG. 2 is a block diagram of a received signal processing system installed with the M-ary-modulation-capable equalizing processing apparatus and a receiver into which the received signal processing system is incorporated.
Figure 3:
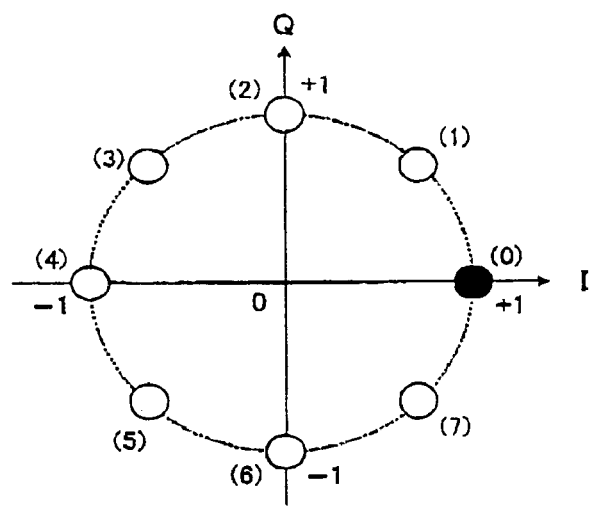
FIG. 3 is a state symbol diagram of an M-ary (8PSK) modulation scheme according to Embodiment 1.

As shown in FIG. 2, receiver 1 according to Embodiment 1 is provided with reception antenna 2 that receives a high-frequency received signal, a received signal processing system 3 that ultimately generates speech data from the high-frequency received signal received in reception antenna 2, and speaker 9 that outputs speech based on the speech data generated in received signal processing system.

Received signal processing system 3 is provided with RF section 4 that downcoverts the high-frequency received signal received in reception antenna 2 into an analog baseband signal, analog/digital converter (ADC) 5 that converts the analog baseband signal into a digital baseband signal, M-ary-modulation-capable equalizing processing apparatus 6 that performs equalizing processing on the digital baseband signal to output a soft-decision value, channel codec section 7 that performs error detection and error correction on the soft decision value to output decoded data, and speech codec section 8 that converts the decoded data into speech data.

Received signal processing system 3 is constructed of a wiring board on which is mounted one or more semiconductor integrated circuits (chips) obtained by integrating into each circuit one or more of RF section 4, analog/digital converter 5, M-ary-modulation-capable equalizing processing apparatus 6, channel codec section 7, and speech codec section 8.

[Configuration of the M-ary-modulation-capable Equalizing Processing Apparatus]

Figure 1:
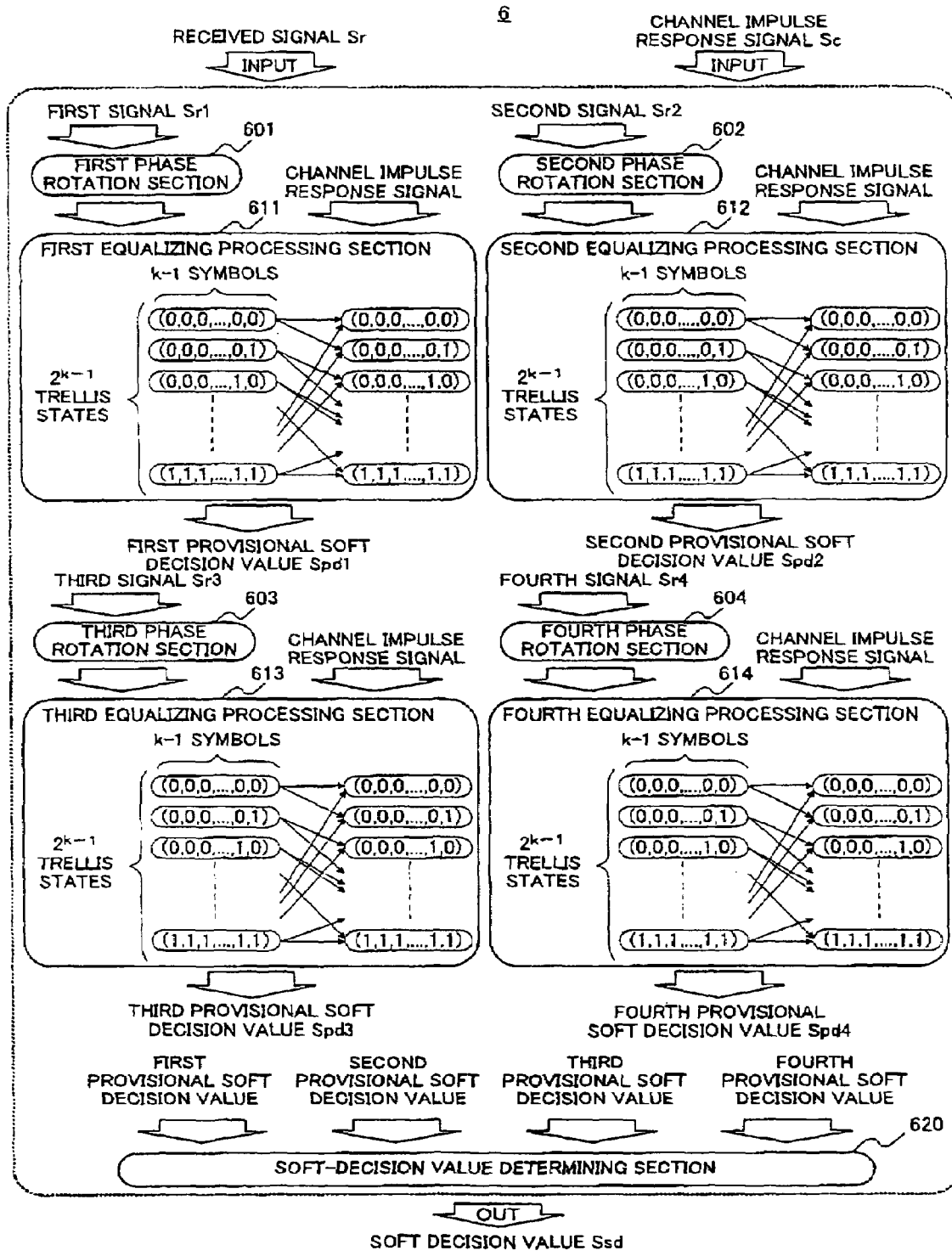
FIG. 1 is a block diagram of an M-ary-modulation-capable equalizing processing apparatus according to Embodiment 1 of the invention.

As shown in FIG. 1, M-ary-modulation-capable equalizing processing apparatus 6 constituting part of receiver 1 and received signal processing system 3 as shown in FIG. 2 is provided with a signal dividing section that divides received signal Sr that has a plurality of information amounts "3" per symbol and that is converted into a digital baseband signal into a first signal Sr1 to fourth signal Sr4 having information of one bit per symbol, first phase rotation section 601, second phase rotation section 602, third phase rotation section 603 and fourth phase rotation section 604 that respectively rotate phases of the first signal Sr1 to fourth signal Sr4 by $\pi/8$, $3\pi/8$, $5\pi/8$ or $7\pi/8$, first equalizing processing section 611, second equalizing processing section 612, third equalizing processing section 613 and fourth equalizing processing section 614 which respectively perform equalizing processing based on the Viterbi equalizing algorithm on phase-rotated first signal Sr1 to fourth signal Sr4 and channel impulse response signal Sc of k taps representing the transmission path status estimated by application processing, and output first provisional soft decision value Spd1 to fourth provisional soft decision value Spd4, and soft-decision value determining section 620 that makes soft decisions on whether first provisional soft decision value Spd1 to fourth provisional soft decision value Spd4 belong to symbols respectively in ranges of (−1(7)~2), (0~3), (1~4) and (2~5). Soft-decision value determining section 620 determines a soft decision value Ssd corresponding to three bits.

Herein, as the signal dividing section, it is possible to actually use received signal storage 630 of M-ary-modulation-capable equalizing processing apparatus 6 according to Embodiment 4 described later.

[M-ary-modulation-capable Equalizing Processing Method]

Described below are the operation of receiver 1 and received signal processing system 3 as shown in FIG. 2 described previously and M-ary-modulation-capable equalizing processing apparatus 6 as shown in FIG. 1, and an M-ary-modulation-capable equalizing processing method according to Embodiment 1.

First, as shown in FIG. 2, reception antenna 2 of receiver 1 receives a high-frequency received signal. The high-frequency received signal is down converted into an analog baseband signal in RF section 4, and the analog baseband signal is converted into a digital baseband signal in analog/digital converter 5.

The received signal Sr that is converted into a digital baseband signal has information amounts of three bits per symbol. The received signal Sr is divided into the first signal Sr1 to fourth signal Sr4 having information of one bit per symbol by the signal dividing section, not shown, in M-ary-modulation-capable equalizing processing apparatus 6 as shown in FIG. 1.

Figure 4:
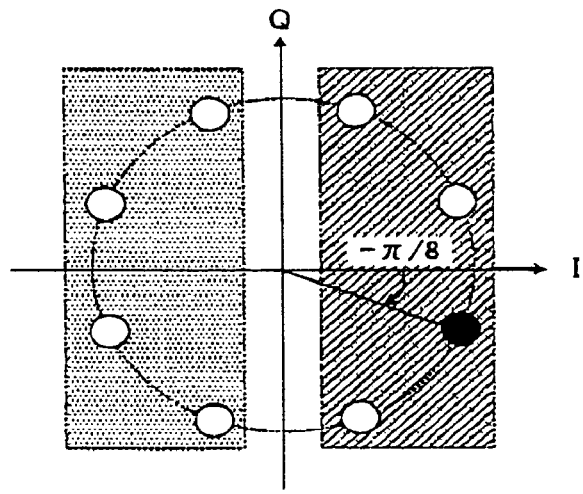
FIG. 4 is a symbol state diagram with first phase rotation in the M-ary modulation scheme according to Embodiment 1.

First phase rotation section 601 rotates the phase of first signal Sr1 by $\pi/8$. The phase-shifted first signal Sr1 is input to first equalizing processing section 611 together with channel impulse response signal Sc. Based on the 8PSK symbol state diagram provided with phase rotation of $-\pi/8$ as shown in FIG. 4, first equalizing processing section 611 performs equalizing processing on first signal Sr1, and generates first provisional soft decision value Spd1 such that first signal Sr1 belongs to either symbol "0", "1", "2" or "7" to output.

Figure 5:
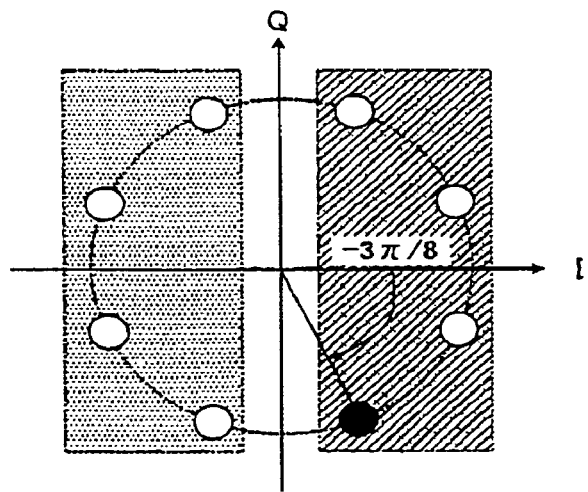
FIG. 5 is a symbol state diagram with second phase rotation.

Hereinafter, similarly, second phase rotation section 602 rotates the phase of second signal Sr2 by $3\pi/8$. The phase-shifted second signal Sr2 is input to second equalizing processing section 612 together with channel impulse response signal Sc. Based on the 8PSK symbol state diagram provided with phase rotation of $-3\pi/8$ as shown in FIG. 5, second equalizing processing section 612 performs equalizing processing on second signal Sr2, and generates second provisional soft decision value Spd2 such that second signal Sr2 belongs to either symbol "0", "1", "2" or "3" to output.

Figure 6:
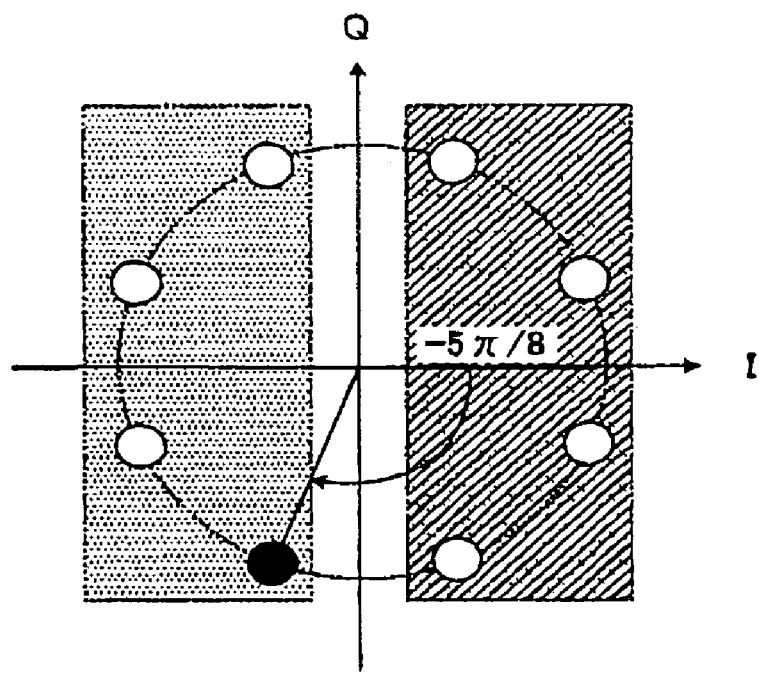
FIG. 6 is a symbol state diagram with third phase rotation.

Third phase rotation section 603 rotates the phase of third signal Sr3 by $5\pi/8$. The phase-shifted third signal Sr3 is input to third equalizing processing section 613 together with channel impulse response signal Sc. Based on the 8PSK symbol state diagram provided with phase rotation of $-5\pi/8$ as shown in FIG. 6, third equalizing processing section 613 performs equalizing processing on third signal Sr3, and generates third provisional soft decision value Spd3 such that third signal Sr3 belongs to either symbol "1", "2", "3" or "4" to output.

Figure 7:
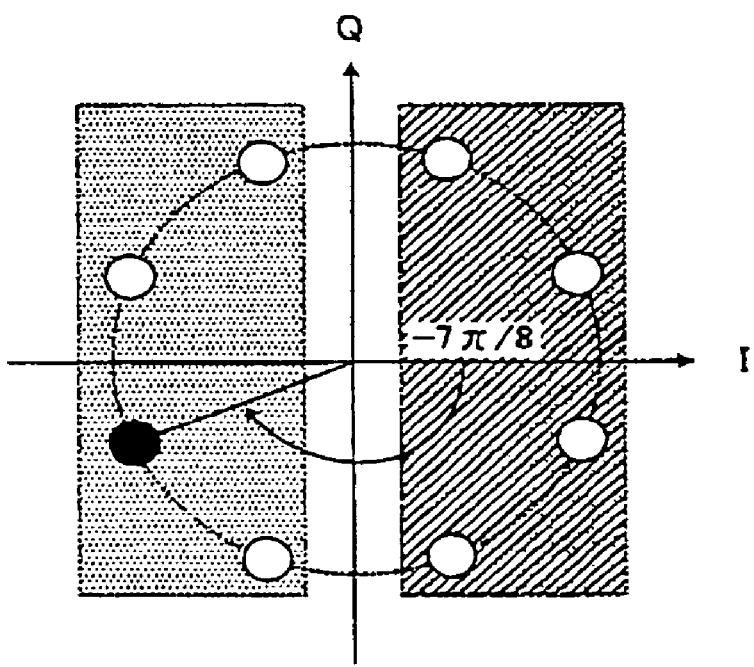
FIG. 7 is a symbol state diagram with fourth phase rotation.

Fourth phase rotation section 604 rotates the phase of fourth signal Sr4 by $7\pi/8$. The phase-shifted fourth signal Sr4 is input to fourth equalizing processing section 614 together with channel impulse response signal Sc. Based on the 8PSK symbol state diagram provided with phase rotation of $-7\pi/8$ as shown in FIG. 7, fourth equalizing processing section 614 performs equalizing processing on fourth signal Sr4, and generates fourth provisional soft decision value Spd4 such that fourth signal Sr4 belongs to either symbol "2", "3", "4" or "5" to output.

The first provisional soft decision value Spd1 to fourth provisional soft decision value Spd4 are input to soft-decision value determining section 620, and the section 620 determines soft decision values Ssd of three bits belonging to each symbol based on the first provisional soft decision value Spd1 to fourth provisional soft decision value Spd4.

Figure 8:
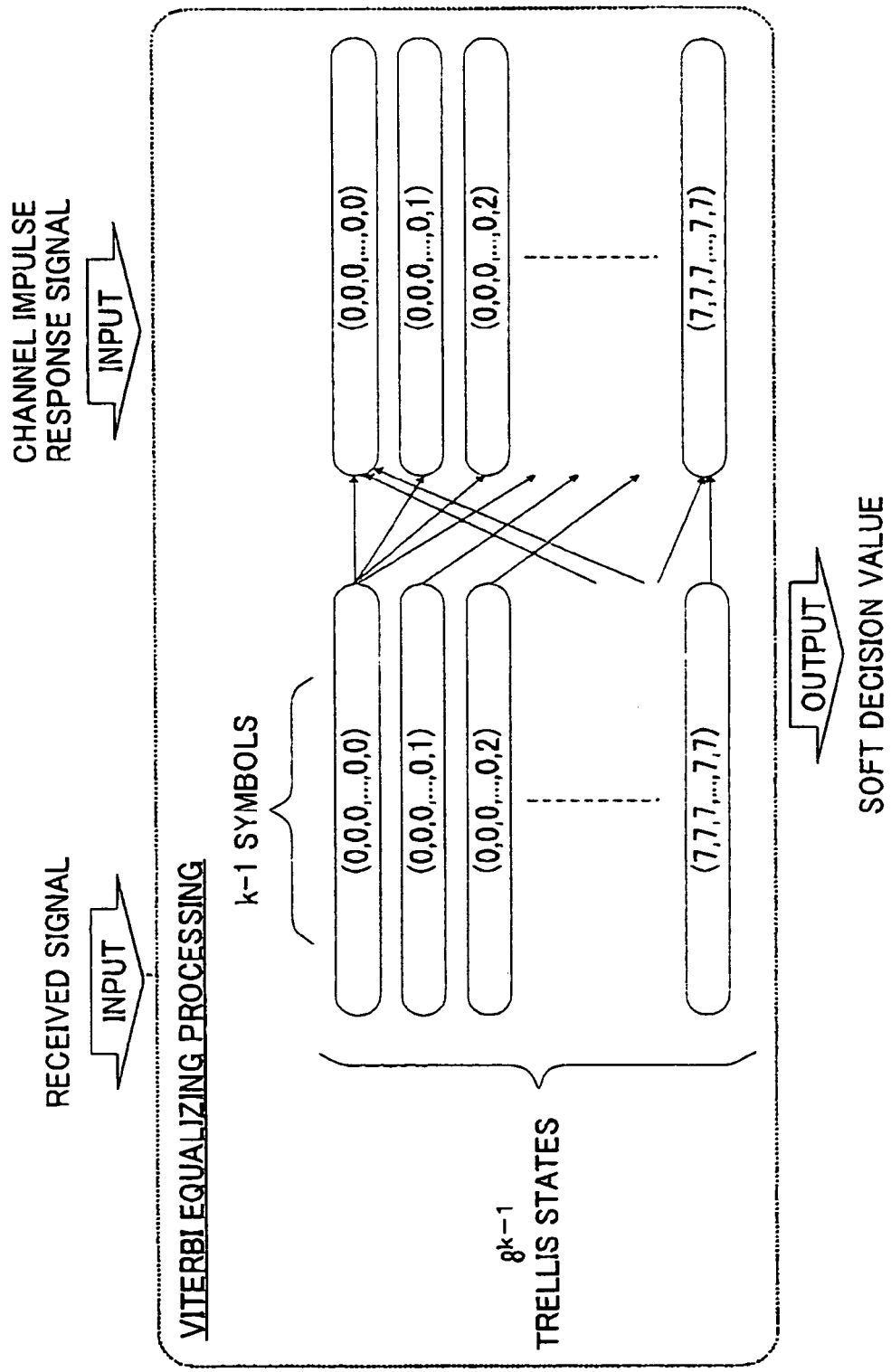
FIG. 8 is a block diagram showing a comparative example of the M-ary-modulation-capable equalizing processing apparatus according to Embodiment 1.

FIG. 8 illustrates a general equalizing processing apparatus of 8PSK modulation scheme as a comparative example. The equalizing processing apparatus of the comparative example executes processing for evaluating eight transitions with respect to $8^{k-1}$ trellis states, and therefore, requires equalizing processing amounts of the order of $8^{k-1}$.

In contrast thereto, M-ary-modulation-capable equalizing processing apparatus 6 according to Embodiment 1 executes four times the processing for evaluating two transitions with respect to $2^{k-1}$ trellis states, thereby only requiring equalizing processing amounts of the order of $2^k \times 4$, and enables reductions of about $4^{k-1}$ in equalizing processing amount.

The soft-decision value Ssd output from soft-decision value determining section 620 of M-ary-modulation-capable equalizing processing apparatus 6 is input to channel codec section 7 as shown in FIG. 2, and the section 7 performs error detection and error correction on the soft-decision value. Decoded data output from channel codec section 7 is input to speech codec section 8, and the section 8 converts the decoded data into speech data. Then, the speech data is input to speaker 9, and speaker 9 outputs speech.

Thus, according to M-ary-modulation-capable equalizing processing apparatus 6 and M-ary-modulation-capable equalizing processing method according to Embodiment 1, first signal Sr1 to fourth signal Sr4 having information of one bit per symbol are generated from the received signal Sr having information amounts "3" per symbol, phases of the first signal Sr1 to fourth signal Sr4 are rotated respectively by $\pi/8$, $3\pi/8$, $5\pi/8$ or $7\pi/8$, the soft decision is made on whether each of the phase-rotated first signal Sr1 to fourth signal Sr4 belongs to either symbol respectively in a range of (−1~2), (0~3), (1~4) or (2~5), and the soft decision value Ssd of each bit can be determined from first provisional soft decision value Spd1 to fourth provisional soft decision value Spd4, whereby it is possible to prevent exponential increases in equalizing processing amount with increases in information amount per symbol, while improving bit error rate characteristics.

Further, according to received signal processing system 3 and receiver 1 according to Embodiment 1, it is possible to reduce processing amounts of received signal Sr and increase the communication time and waiting time by the aforementioned M-ary-modulation-capable equalizing processing apparatus 6 provided therein.

Embodiment 2

Embodiment 2 of the invention describes a specific example of soft-decision value determining section 620 of M-ary-modulation-capable equalizing processing apparatus 6 according to Embodiment 1.

[Configuration of the Soft-decision Value Determining Section of the M-ary-modulation-capable Equalizing Processing Apparatus]

Figure 9:
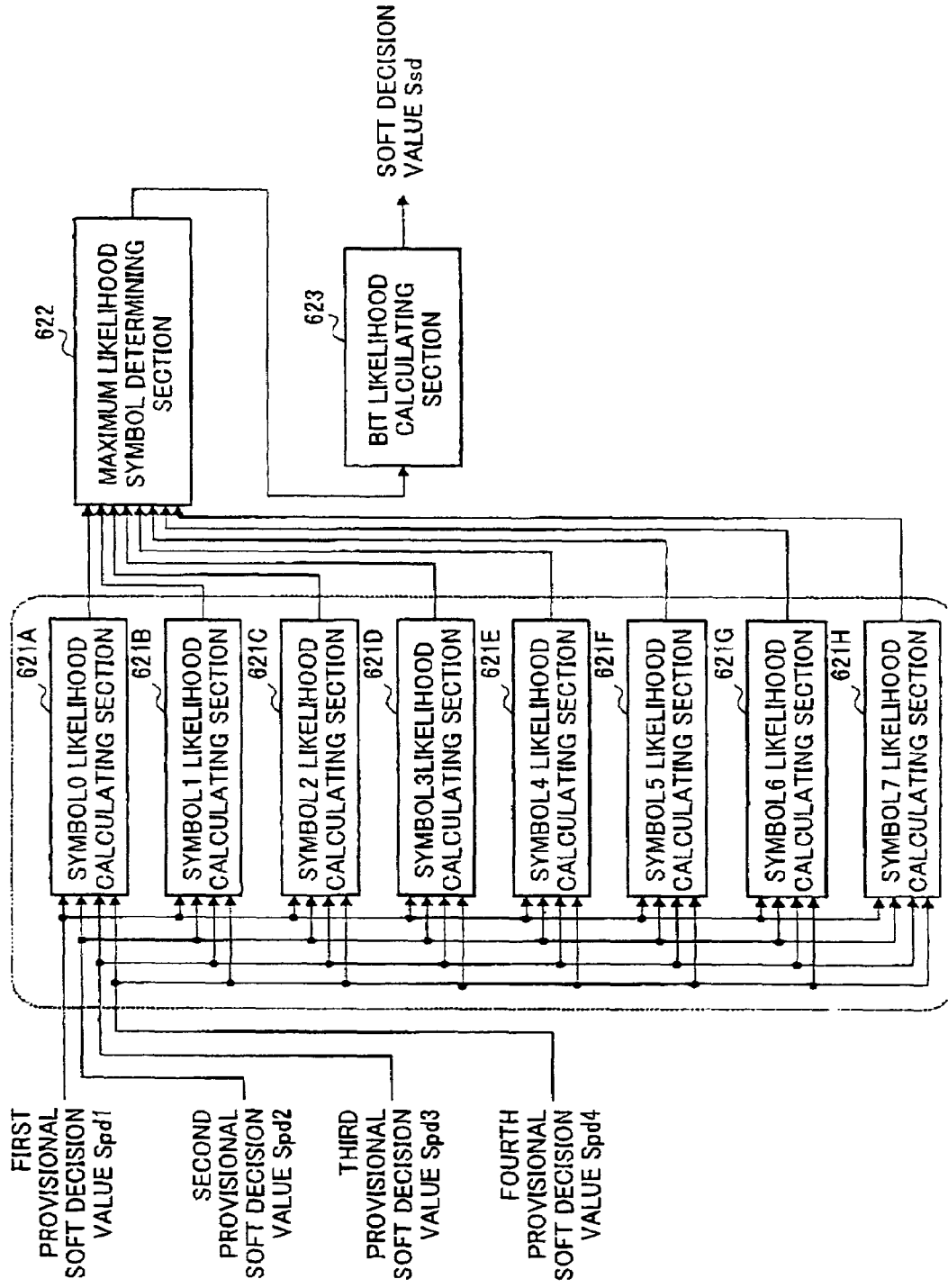
FIG. 9 is a block diagram of a soft-decision value determining section of the M-ary-modulation-capable equalizing processing apparatus according to Embodiment 2 of the invention.

As shown in FIG. 9, soft-decision value determining section 620 of M-ary-modulation-capable equalizing processing apparatus 6 according to Embodiment 2 is provided with symbol likelihood calculating sections 621A to 621H that calculate likelihoods of symbols on first provisional soft decision value Spd1 to fourth provisional soft decision value Spd4 respectively output from first equalizing processing section 611 to fourth equalizing processing section 614 (see FIG. 1), maximum likelihood symbol determining section 622 which obtains the maximum value of likelihoods of symbols and determines a symbol having a likelihood of the maximum value, and bit likelihood calculating section 623 which decomposes the symbol with the likelihood of the maximum value into bits, and assigns the same likelihood to each decomposed bit.

Symbol likelihood calculating section 621A calculates the symbol likelihood of symbol "0". Symbol likelihood calculating section 621B calculates the symbol likelihood of symbol "1". Symbol likelihood calculating section 621C calculates the symbol likelihood of symbol "2". Symbol likelihood calculating section 621D calculates the symbol likelihood of symbol "3". Symbol likelihood calculating section 621E calculates the symbol likelihood of symbol "4". Symbol likelihood calculating section 621F calculates the symbol likelihood of symbol "5". Symbol likelihood calculating section 621G calculates the symbol likelihood of symbol "6". Symbol likelihood calculating section 621H calculates the symbol likelihood of symbol "7".

Figure 10:
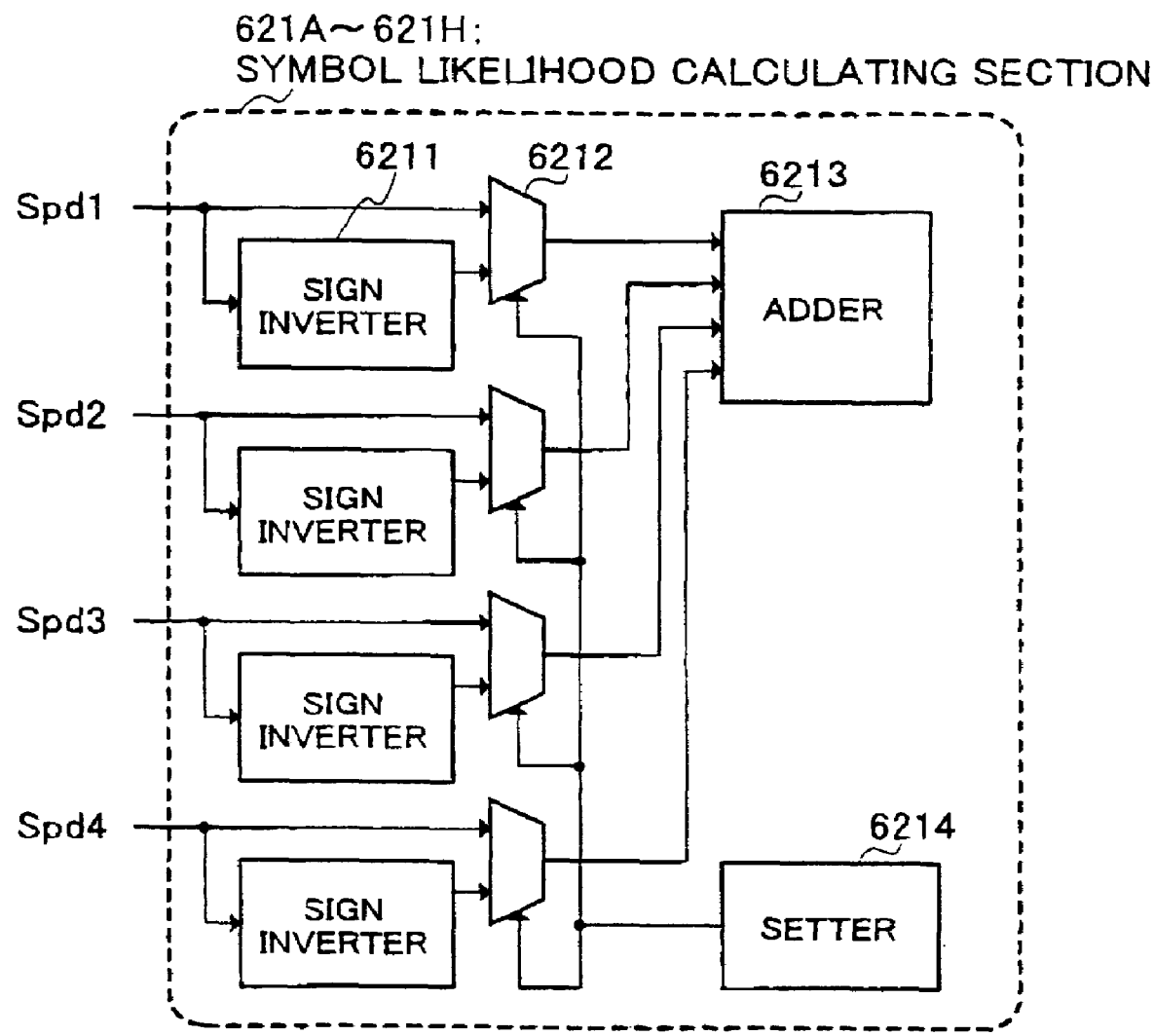
FIG. 10 is a block diagram of a symbol likelihood calculating section of the soft-decision value determining section as shown in FIG. 9.

As shown in FIG. 10, each of symbol likelihood calculating sections 621A to 621H is provided with four sign inverters 6211 that respectively invert a sign of first provisional soft decision value Spd1 to fourth provisional soft decision value Spd4, four selectors 6212 that select respective one of first provisional soft decision value Spd1 to fourth provisional soft decision value Spd4 or corresponding sign-inverted provisional soft decision value, adder 6213 that adds provisional soft decision values output from the four selectors 6212 to calculate the symbol likelihood, and setter 6214 which outputs information to the selectors 6212 as a selection switching signal where the information is based on that a symbol to determine is output as positive logic or negative logic as a provisional soft-decision value from first equalizing processing section 611 to fourth equalizing processing section 614.

Maximum likelihood symbol determining section 622 scans symbol "0" likelihood to symbol "7" likelihood output from symbol likelihood calculating sections 621A to 621H to calculate the maximum value, and thereby determines a symbol with the maximum value and the likelihood of the symbol.

[Operation of the Soft-decision Value Determining Section]

The operation of aforementioned soft decision value determining section 620 will be described below.

In the case of determining symbol "0" likelihood, setter 6214 of symbol likelihood calculating section 621A outputs to each selector 6212 a selection switching signal to select first provisional soft decision value Spd1 and second provisional soft decision value Spd2 as positive logic, while selecting third provisional soft decision value Spd3 and fourth provisional soft decision value Spd4 as negative logic.

Each selector 6212 outputs to adder 6213 first provisional soft decision value Spd1 and second provisional soft decision value Spd2, and inverted provisional soft decision values of third provisional soft decision value Spd3 and fourth provisional soft decision value Spd4 inverted in sign inverters 6211. Adder 6213 adds the provisional soft decision values, and thereby determines the symbol "0" likelihood.

Similarly, symbol likelihood calculating section 621B determines the symbol "1" likelihood. Symbol likelihood calculating section 621C determines the symbol "2" likelihood. Symbol likelihood calculating section 621D determines the symbol "3" likelihood. Symbol likelihood calculating section 621E determines the symbol "4" likelihood. Symbol likelihood calculating section 621F determines the symbol "5" likelihood. Symbol likelihood calculating section 621G determines the symbol "6" likelihood. Symbol likelihood calculating section 621H determines the symbol "7" likelihood.

When symbol "0" to symbol "7" likelihoods are determined, maximum likelihood symbol determining section 622 calculates the maximum value, and the symbol can be determined. Then, based on the determined symbol, bit likelihood calculating section 623 decomposes the symbol with the likelihood of the maximum value into bits, and assigns the same likelihood to each decomposed bit.

Thus, in M-ary-modulation-capable equalizing processing apparatus 6 and M-ary-modulation-capable equalizing processing method according to Embodiment 2, since it is further possible to decompose a symbol with the likelihood of the maximum value into bits and assign the same likelihood to each decomposed bit, it is possible to decrease processing amounts to determine the soft decision value Ssd.

Embodiment 3

Embodiment 3 of the invention describes another specific example of soft-decision value determining section 620 of M-ary-modulation-capable equalizing processing apparatus 6 according to Embodiment 1.

[Configuration of the Soft-decision Value Determining Section of the M-ary-modulation-capable Equalizing Processing Apparatus]

Figure 11:
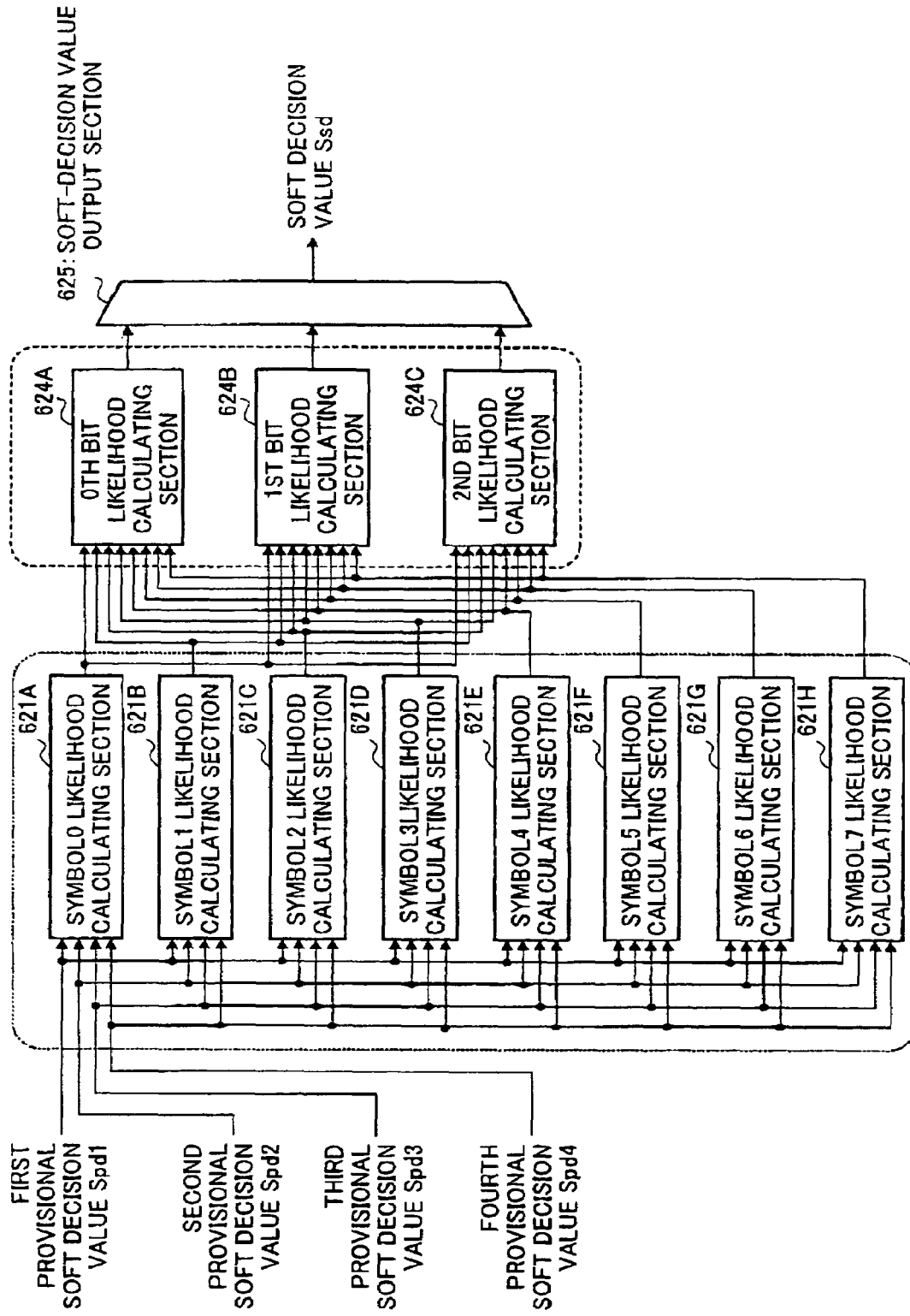
FIG. 11 is a block diagram of a soft-decision value determining section of an M-ary-modulation-capable equalizing processing apparatus according to Embodiment 3 of the invention.

As shown in FIG. 11, soft-decision value determining section 620 of M-ary-modulation-capable equalizing processing apparatus 6 according to Embodiment 3 is provided with symbol likelihood calculating sections 621A to 621H that calculate likelihoods of symbols on first provisional soft decision value Spd1 to fourth provisional soft decision value Spd4 respectively output from first equalizing processing section 611 to fourth equalizing processing section 614 (see FIG. 1), 0th bit likelihood calculating section 624A, 1st bit likelihood calculating section 624B and 2nd bit likelihood calculating section 624C that calculate the likelihood of each respective bit of symbols output from symbol likelihood calculating sections 621A to 621H, and soft-decision value output section 625 that outputs in the order of 0th bit to 2nd bit outputs of 0th to 2nd bit likelihood calculating section 624A to 624C.

The specific configuration of each of symbol likelihood calculating sections 621A to 621H is the same as that of each of symbol likelihood calculating sections 621A to 621H of soft-decision value determining section 620 according to Embodiment 2 as shown in FIGS. 9 and 10, and redundant descriptions thereof are omitted.

Figure 12:
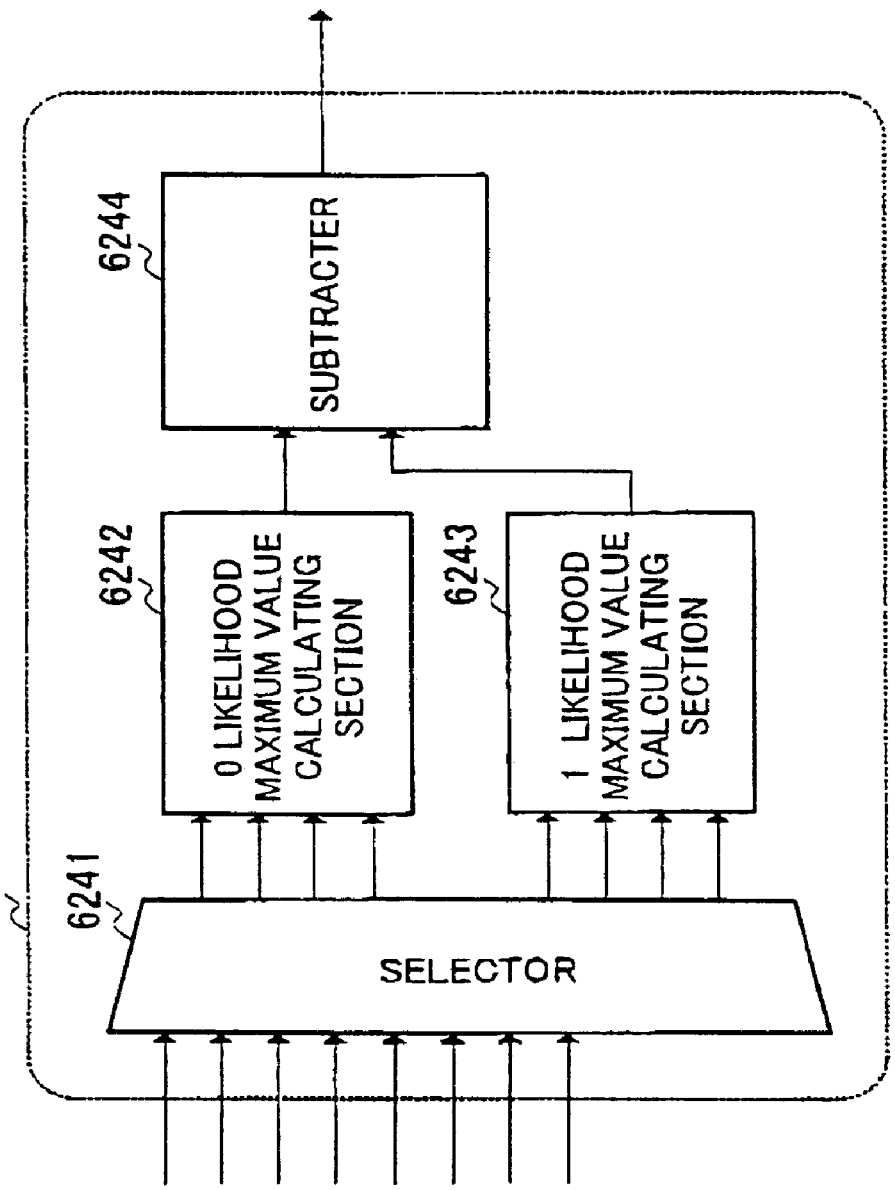
FIG. 12 is a block diagram of a bit likelihood calculating section of the soft-decision value determining section as shown in FIG. 11.

At the time each of the symbol "0" likelihood to symbol "7" likelihood is input, each of the bit likelihood calculating sections 624A to 624C decomposes each symbol into bits, and makes a decision of bit likelihood on each decomposed bit. As shown in FIG. 12, each of 0th to 2nd bit likelihood calculating sections 624A to 624C is provided with selector 6241 which receives the symbol "0" likelihood to symbol "7" likelihood and selects the symbol likelihood of "0" or "1" of a bit to be determined, "0" likelihood maximum value calculating section 6242 that obtains the maximum value from among symbol likelihoods such that the bit to be determined is "0", "1" likelihood maximum value calculating section 6243 that obtains the maximum value from among symbol likelihoods such that the bit to be determined is "1", and subtracter 6244 that subtracts an output of "0" likelihood maximum value calculating section 6242 from an output of "1" likelihood maximum value calculating section 6243.

[Operation of the Soft-decision Value Determining Section]

The operation of aforementioned soft-decision value determining section 620 will be described below.

First, as in symbol likelihood calculating sections 621A to 621H of soft-decision value determining section 620 according to Embodiment 2, symbol likelihood calculating sections 621A to 621H of soft-decision value determining section 620 as shown in FIG. 11 determine the symbol "0" likelihood to symbol "7" likelihood.

The determined symbol "0" likelihood to symbol "7" likelihood are input to 0th to 2nd bit likelihood calculating sections 624A to 624C. Since the symbol "0" likelihood is decomposed to (000), selector 6241 in 0th bit likelihood calculating section 624A selects "0" likelihood maximum value calculating section 6242, selector 6241 in 1st bit likelihood calculating section 624B selects "0" likelihood maximum value calculating section 6242, and selector 6241 in 2nd bit likelihood calculating section 624C selects "0" likelihood maximum value calculating section 6242.

Similarly, in the symbol "1" likelihood to symbol "7" likelihood, selectors 6241 in 0th to 2nd bit likelihood calculating sections 624A to 624C select "0" likelihood maximum value calculating section 6242 or "1" likelihood maximum value calculating section 6243.

As a result, in 0th bit likelihood calculating section 624A, "0" likelihood maximum value calculating section 6242 is selected on symbol likelihoods of symbols "0", "2", "4" and "6", "1" likelihood maximum value calculating section 6243 is selected on symbol likelihoods of symbols "1", "3", "5" and "7", subtracter 6244 subtracts an output of "0" likelihood maximum value calculating section 6242 from an output of "1" likelihood maximum value calculating section 6243, and it is thereby possible to determine the 0th bit likelihood. Similarly, 1st bit likelihood calculating section 624B determines the 1st bit likelihood, and 2nd bit likelihood calculating section 624C determines the 2nd bit likelihood.

Each of the 0th bit likelihood to 2nd bit likelihood respectively determined in 0th bit likelihood calculating section 624A to 2nd bit likelihood calculating section 624C can be output from soft-decision value output section 625 as the soft decision value Ssd.

Thus, in M-ary-modulation-capable equalizing processing apparatus 6 and M-ary-modulation-capable equalizing processing method according to Embodiment 3, it is possible to calculate the bit likelihood from results of calculation of symbol likelihood, and it is thereby possible to improve accuracy in determination on soft decision value Ssd.

Embodiment 4

Embodiment 4 and Embodiment 5 described later of the invention explain M-ary-modulation-capable equalizing processing apparatus 6 usable in both modulation systems GSM and EDGE. In addition, basic configurations of a receiver and received signal processing system according to Embodiments 4 and 5 are the same as those of receiver 1 and received signal processing system 3 according to Embodiment 1, and redundant descriptions are omitted herein.

[Configuration of the M-ary-modulation-capable Equalizing Processing Apparatus]

Figure 13:
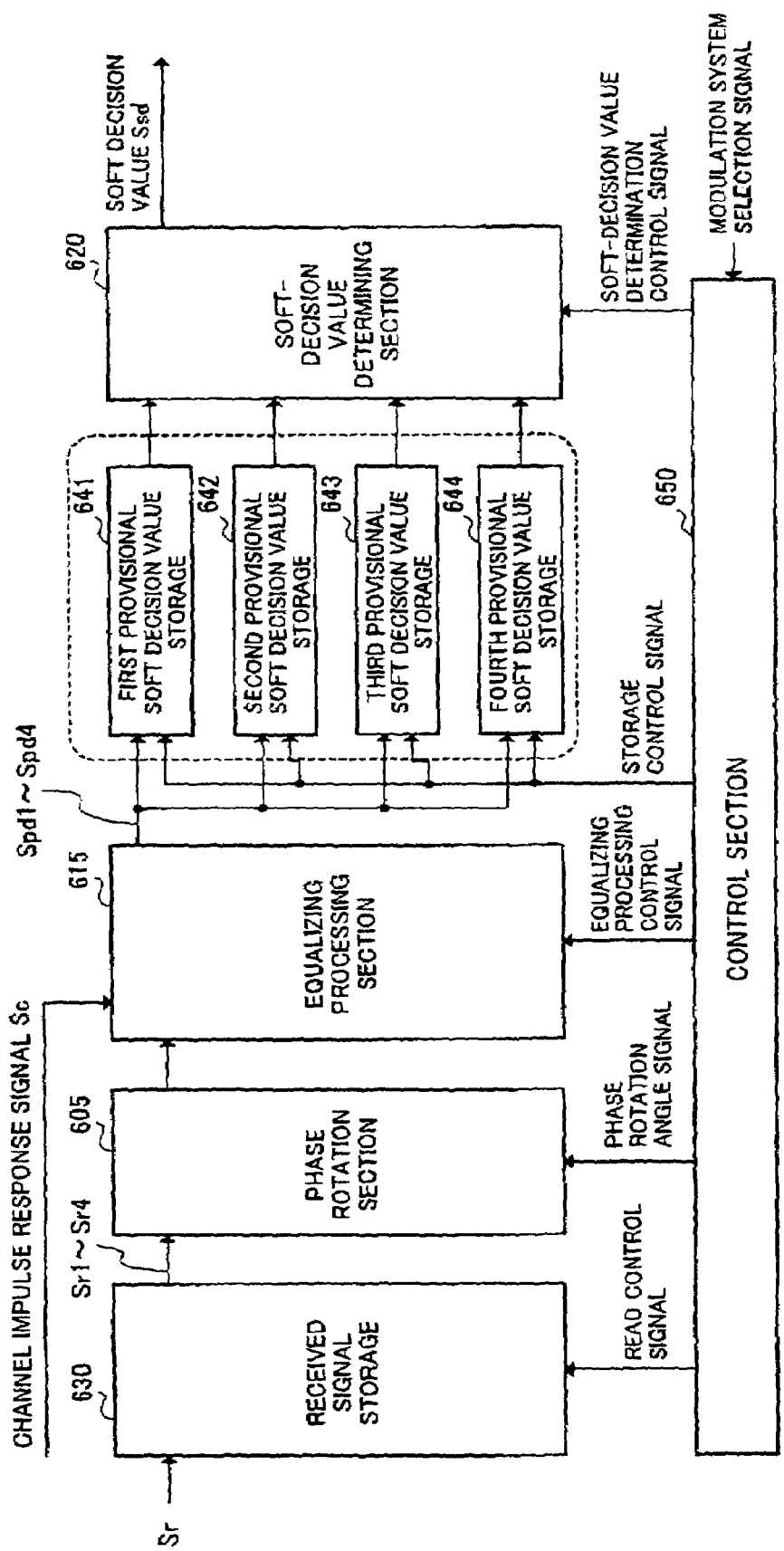
FIG. 13 is a block diagram of an M-ary-modulation-capable equalizing processing apparatus according to Embodiment 4 of the invention.

As shown in FIG. 13, M-ary-modulation-capable equalizing processing apparatus 6 according to Embodiment 4 is provided with received signal storage 630 which stores the received signal Sr that has a plurality of information amounts "3" per symbol and that is converted into a digital baseband signal, and divides the stored received signal Sr into the first signal Sr1 to fourth signal Sr4 having information of one bit per symbol to read sequentially based on a read control signal, phase rotation section 605 which rotates a phase of each of the first signal Sr1 to fourth signal Sr4 sequentially based on a phase rotation angle signal, equalizing processing section 615 which performs equalizing processing based on the Viterbi equalizing algorithm sequentially on each of the phase-rotated first signal Sr1 to fourth signal Sr4 and channel impulse response signal Sc based on an equalizing processing control signal, and outputs the first provisional soft decision value Spd1 to fourth provisional soft decision value Spd4, first provisional soft decision value storage 641 to fourth provisional soft decision value storage 644 which respectively store first provisional soft decision value Spd1 to fourth provisional soft decision value Spd4 based on a storage control signal, soft-decision value determining section 620 that makes a soft decision on whether each of the first provisional soft decision value Spd1 to fourth provisional soft decision value Spd4 belongs to a symbol respectively in a range of (−1(7) ~2), (0~3), (1~4) or (2~5) based on a soft-decision value determination control signal, and control section 650 which outputs the read control signal, phase rotation angle signal, equalizing processing control signal, storage control signal and soft-decision value determination control signal.

Practically used as received signal storage 630 can be nonvolatile memory such as Dynamic Random Access Memory (DRAM) and Static Random Access Memory (SRAM) capable of storing the received signal Sr temporarily, and sequentially reading the stored received signal as first signal Sr1 to fourth signal Sr4 based on the read control signal.

Embodiment 4 provides a single phase rotation section 605 and a single equalizing processing section 615. Phase rotation section 605 receives the first signal Sr1 to fourth signal Sr4 sequentially from received signal storage 630, and therefore, sequentially rotates the phase of each of the first signal Sr1 to fourth signal Sr4 based on the phase rotation angle signal. Similarly, equalizing processing section 615 sequentially receives as its inputs the phase-rotated first signal Sr1 to fourth signal Sr4, and therefore, performs the equalizing processing for each input.

First provisional soft decision value storage 641 performs the equalizing processing on the phase-rotated first signal Sr1, and stores first provisional soft decision value Spd1 that is output as a result of the processing. Second provisional soft decision value storage 642 performs the equalizing processing on the phase-rotated second signal Sr2, and stores second provisional soft decision value Spd2 that is output as a result of the processing. Third provisional soft decision value storage 643 performs the equalizing processing on the phase-rotated third signal Sr3, and stores third provisional soft decision value Spd3 that is output as a result of the processing. Fourth provisional soft decision value storage 644 performs the equalizing processing on the phase-rotated fourth signal Sr4, and stores fourth provisional soft decision value Spd4 that is output as a result of the processing.

Control section 650 receives a modulation system selection signal to switch the modulation system to GSM or EDGE. Based on the modulation system selection signal, control section 650 controls the output of the phase rotation angle signal to phase rotation section 605 and the output of the number of equalizing processing times to equalizing processing section 615.

[Operation of the M-ary-modulation-capable Equalizing Processing Apparatus]

The operation of the above-mentioned M-ary-modulation-capable equalizing processing apparatus 6 will be described below.

First, the received signal Sr that is converted into a digital baseband signal is input to received signal storage 630 of M-ary-modulation-capable equalizing processing apparatus 6, and stored in received signal storage 630. Control section 650 receives a modulation system selection signal to select the EDGE modulation system, and based on the modulation system selection signal, outputs a read control signal to received signal storage 630.

Based on the read control signal, received signal storage 630 reads out the first signal Sr1 of the stored received signal Sr1, and inputs the first signal Sr1 to phase rotation section 605. Control section 650 outputs a phase rotation angle signal to control a phase rotation angle to $\pi/8$ to phase rotation section 605. Based on the phase rotation angle signal, phase rotation section 605 rotates the phase of the first signal Sr1, and outputs the phase-rotated first signal Sr1 to equalizing processing section 615.

Control section 650 outputs an equalizing processing control signal to equalizing processing section 615. Based on the equalizing processing control signal, equalizing processing section 615 performs the equalizing processing on the first signal Sr1, and outputs first provisional soft decision value Spd1. Further, control section 650 outputs a storage control signal to enable write to first provisional soft decision value storage 641, and based on the storage control signal, first provisional soft decision value storage 641 stores the first provisional soft decision value Spd1.

Similarly, based on the read control signal output from control section 650, received signal storage 630 reads out the second signal Sr2, and inputs the second signal Sr2 to phase rotation section 605. Control section 650 outputs a phase rotation angle signal to control a phase rotation angle to $3\pi/8$ to phase rotation section 605. Based on the phase rotation angle signal, phase rotation section 605 rotates the phase of the second signal Sr2 and outputs the phase-rotated second signal Sr2 to equalizing processing section 615. Control section 650 outputs the equalizing processing control signal to equalizing processing section 615. Based on the equalizing processing control signal, equalizing processing section 615 performs the equalizing processing on the second signal Sr2, and outputs second provisional soft decision value Spd2. Further, control section 650 outputs the storage control signal to second provisional soft decision value storage 642, and based on the storage control signal, second provisional soft decision value storage 642 stores the second provisional soft decision value Spd2.

Subsequently, based on the read control signal output from control section 650, received signal storage 630 reads out the third signal Sr3, and inputs the third signal Sr3 to phase rotation section 605. Control section 650 outputs a phase rotation angle signal to control a phase rotation angle to $5\pi/8$ to phase rotation section 605. Based on the phase rotation angle signal, phase rotation section 605 rotates the phase of the third signal Sr3 and outputs the phase-rotated third signal Sr3 to equalizing processing section 615. Control section 650 outputs the equalizing processing control signal to equalizing processing section 615. Based on the equalizing processing control signal, equalizing processing section 615 performs the equalizing processing on the third signal Sr3, and outputs third provisional soft decision value Spd3. Further, control section 650 outputs the storage control signal to third provisional soft decision value storage 643, and based on the storage control signal, third provisional soft decision value storage 643 stores third provisional soft decision value Spd3.

Then, based on the read control signal output from control section 650, received signal storage 630 reads out the fourth signal Sr4, and inputs the fourth signal Sr4 to phase rotation section 605. Control section 650 outputs a phase rotation angle signal to control a phase rotation angle to $7\Pi/8$ to phase rotation section 605. Based on the phase rotation angle signal, phase rotation section 605 rotates the phase of the fourth signal Sr4 and outputs the phase-rotated fourth signal Sr4 to equalizing processing section 615. Control section 650 outputs the equalizing processing control signal to equalizing processing section 615. Based on the equalizing processing control signal, equalizing processing section 615 performs the equalizing processing on the fourth signal Sr4, and outputs fourth provisional soft decision value Spd4. Further, control section 650 outputs the storage control signal to fourth provisional soft decision value storage 644, and based on the storage control signal, fourth provisional soft decision value storage 644 stores the fourth provisional soft decision value Spd4.

When all the equalizing processing is completed on the first signal Sr1 to fourth signal Sr4 of the received signal Sr, control section 650 outputs a storage control signal to enable readout of first provisional soft decision value storage 641 to fourth provisional soft decision value storage 644. Based on the storage control signal, first provisional soft decision value Spd1 to fourth provisional soft decision value Spd4 respectively stored in first provisional soft decision value storage 641 to fourth provisional soft decision value storage 644 are output to soft-decision value determining section 620. Control section 650 further outputs a soft-decision value determination control signal to soft-decision value determining section 620, and soft-decision value determining section 620 outputs the soft decision value Ssd based on the first to fourth provisional soft decision values Spd1 to Spd4.

In such a case of the EDGE modulation system, in M-ary-modulation-capable equalizing processing apparatus 6, based on a read control signal output from control section 650, the first signal Sr1 to fourth signal Sr4 are sequentially read from received signal storage 630, total four times of phase rotation and equalizing processing are sequentially carried on the first signal Sr1 to fourth signal Sr4, and the soft decision value Ssd can be output ultimately. M-ary-modulation-capable equalizing processing apparatus 6 according to Embodiment 4 is capable of executing the equalizing processing in other modulation systems. For example, when control section 650 receives a modulation system selection signal to select the GSM modulation system, control section 650 is designed to output control signals to substantially activate equalizing processing section 615 and soft-decision value determining section 620.

Thus, in M-ary-modulation-capable equalizing processing apparatus 6 and M-ary-modulation-capable equalizing processing method according to Embodiment 4, the first signal Sr1 to fourth signal Sr4 are sequentially read from received signal storage 630 based on the read control signal from control section 650, a single phase rotation section 605 rotates the phase of each of the first signal Sr1 to fourth signal Sr4, a single equalizing processing section 615 performs the equalizing processing repeatedly four times on the phase-rotated first signal Sr1 to fourth signal Sr4, and it is thereby possible to reduce circuit scales of phase rotation section 605 and equalizing processing section 615.

Further, in M-ary-modulation-capable equalizing processing apparatus 6 and M-ary-modulation-capable equalizing processing method, it is possible to easily achieve equalizing processing corresponding to a plurality of types of M-ary modulation schemes in the same apparatus, based on a modulation system selection signal input to control section 650.

Embodiment 5

Embodiment 5 of the invention describes an example of combining M-ary-modulation-capable equalizing processing apparatus 6 according to Embodiment 1 and M-ary-modulation-capable equalizing processing apparatus 6 according to Embodiment 4.

[Configuration of the M-ary-modulation-capable Equalizing Processing Apparatus]

Figure 14:
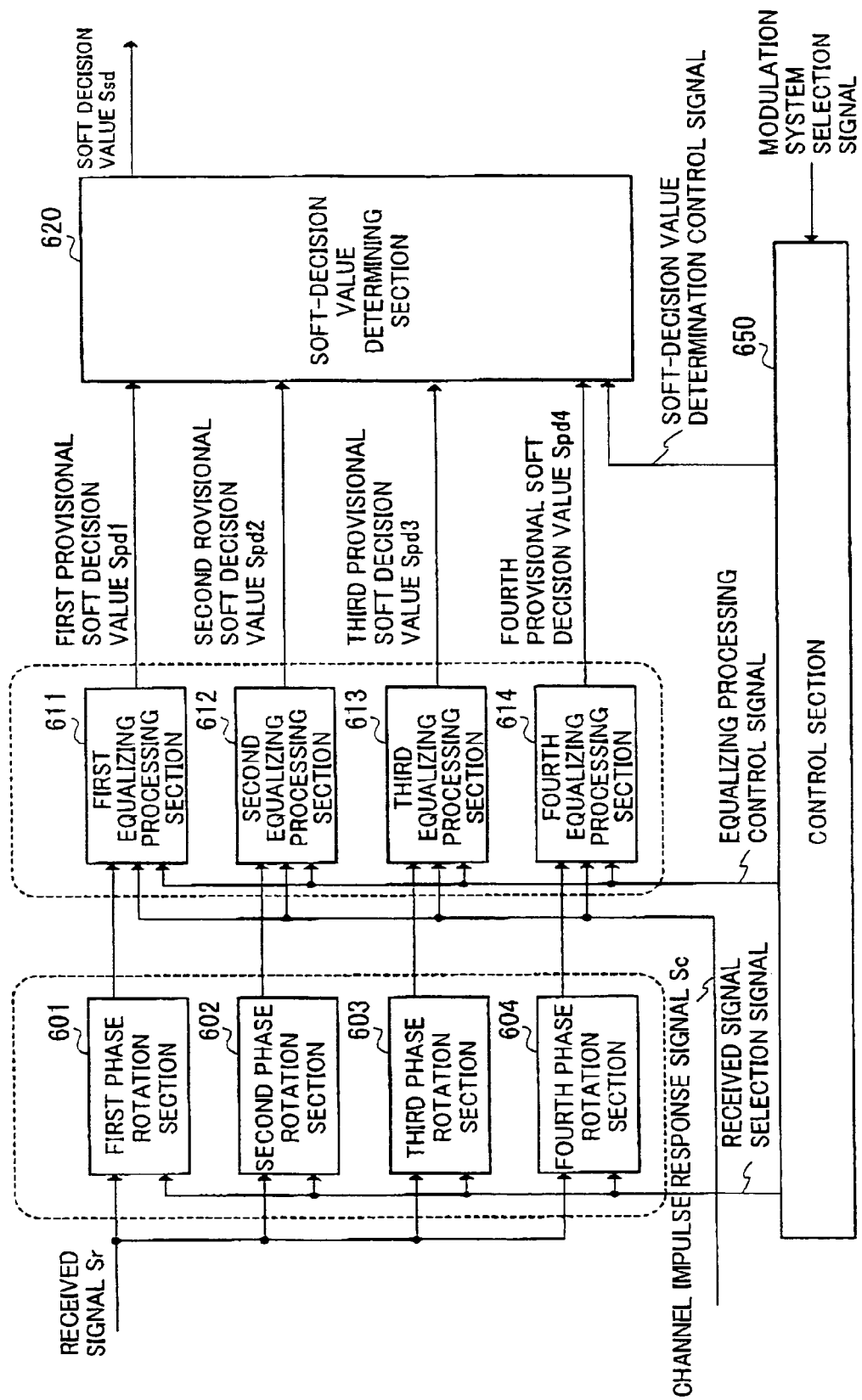
FIG. 14 is a block diagram of an M-ary-modulation-capable equalizing processing apparatus according to Embodiment 5 of the invention.

As shown in FIG. 14, M-ary-modulation-capable equalizing processing apparatus 6 according to Embodiment 5 is provided with first phase rotation section 601 to fourth phase rotation section 604 which receive received signal Sr that has a plurality of information amounts "3" per symbol and that is converted into a digital baseband signal as the first signal Sr1 to fourth signal Sr4 having information of one bit per symbol, and based on phase rotation angle signals, rotate phases of the first signal Sr1 to fourth signal Sr4 by π/8, 3π/8, 5π/8 or 7π/8, respectively, first equalizing processing section 611 to fourth equalizing processing section 614 which perform the equalizing processing based on Viterbi equalizing algorithm on the phase-rotated first signal Sr1 to fourth signal Sr4 and channel impulse response signal Sc and based on the equalizing processing control signal, and output first provisional soft decision value Spd1 to fourth provisional soft decision value Spd4, respectively, soft-decision value determining section 620 that makes a soft decision on whether each of the first provisional soft decision value Spd1 to fourth provisional soft decision value Spd4 belongs to a symbol respectively in a range of (−1 (7)~2), (0~3), (1~4) or (2~5), and control section 650 which outputs the phase rotation angle signal, equalizing processing control signal, and soft-decision value determination control signal.

[Operation of the M-ary-modulation-capable Equalizing Processing Apparatus]

The operation of the above-mentioned M-ary-modulation-capable equalizing processing apparatus 6 will be described below.

First, control section 650 receives a modulation system selection signal to select the EDGE modulation system, and based on the modulation system selection signal, outputs a received signal selection signal to each of first phase rotation section 601 to fourth phase rotation section 604. Based on the received signal selection signal, first phase rotation section 601 receives the first signal Sr1 of the received signal Sr that is converted into a digital baseband signal, and rotates the phase of the first signal Sr1 by π/8. Similarly, second phase rotation section 602 receives the second signal Sr2 of the received signal Sr, and rotates the phase of the second signal Sr2 by 3π/8. Third phase rotation section 603 receives the third signal Sr3 of the received signal Sr, and rotates the phase of the third signal Sr2 by 5π/8. Fourth phase rotation section 604 receives the fourth signal Sr4 of the received signal Sr, and rotates the phase of the fourth signal Sr4 by 7π/8. These phase rotations are carried out in parallel as in M-ary-modulation-capable equalizing processing apparatus 6 according to Embodiment 1.

The first signal Sr1 rotated in phase in first phase rotation section 601 is input to first equalizing processing section 611 together with the channel impulse response signal. First equalizing processing section 611 performs the equalizing processing on the first signal Sr1, and outputs first provisional soft decision value Spd1. The second signal Sr2 rotated in phase in second phase rotation section 602 is input to second equalizing processing section 612 together with the channel impulse response signal. Second equalizing processing section 612 performs the equalizing processing on the second signal Sr2, and outputs second provisional soft decision value Spd2. The third signal Sr3 rotated in phase in third phase rotation section 603 is input to third equalizing processing section 613 together with the channel impulse response signal. Third equalizing processing section 613 performs the equalizing processing on the third signal Sr3, and outputs third provisional soft decision value Spd3. The fourth signal Sr4 rotated in phase in fourth phase rotation section 604 is input to fourth equalizing processing section 614 together with the channel impulse response signal. Fourth equalizing processing section 614 performs the equalizing processing on the fourth signal Sr4, and outputs fourth provisional soft decision value Spd4.

The first provisional soft decision value Spd1 to fourth provisional soft decision value Spd4 are output to soft-decision value determining section 620. Based on the soft-decision value determination control signal output from control section 650, soft-decision value determining section 620 outputs the soft decision value Ssd from the first provisional soft decision value Spd1 to fourth provisional soft decision value Spd4.

In the case of selecting the GSM modulation system substituting for the EDGE modulation system, as in M-ary-modulation-capable equalizing processing apparatus 6 according to Embodiment 4, input to control section 650 is the modulation system selection signal to select the GSM modulation system.

Thus, in M-ary-modulation-capable equalizing processing apparatus 6 and M-ary-modulation-capable equalizing processing method according to Embodiment 5, respective phase rotations of the first signal Sr1 to fourth signal Sr4 can be carried out in parallel respectively in first phase rotation section 601 to fourth phase rotation section 604, and equalizing processing of the phase-rotated first signal Sr1 to fourth signal Sr4 can be carried out in parallel respectively in first equalizing processing section 611 to fourth equalizing processing section 614, whereby it is possible to achieve the equalizing processing of a signal having information of "3" bits per symbol in a short processing time of the same extent as the phase rotation and equalizing processing of a signal having information of "1" bit per symbol.

As described above, according to the present invention, it is possible to provide an M-ary-modulation-capable equalizing processing apparatus, received signal processing system, receiver and M-ary-modulation-capable equalizing processing method enabling reduction in processing amount of the equalizing processing while improving bit error rate characteristics.

In other words, an M-ary-modulation-capable equalizing processing apparatus according to a first feature of the Embodiments of the invention adopts a constitution provided with a signal divider that divides a received signal that has a plurality of information amounts a (a is a natural number) per symbol and that is converted into a digital baseband signal into a first signal to $2^{a-1}$th signal each having information of one bit per symbol, first phase rotator to $2^{a-1}$th phase rotator which respectively rotate phases of the first signal to $2^{a-1}$th signal by $(\pi/2^a+(S(S=1\sim2^{a-1})-1)\pi/2^{a-1})$, first equalizing processor to $2^{a-1}$th equalizing processor which perform equalizing processing based on the Viterbi equalizing algorithm respectively based on phase-rotated first signal to $2^{a-1}$th signal and a channel impulse response signal, and output a first provisional soft decision value to $2^{a-1}$th provisional soft decision value, respectively, and a soft-decision value determiner that makes a soft decision on whether each of the first provisional soft decision value to $2^{a-1}$th provisional soft decision value belongs to a symbol in a range of S–2 to S–$2+2^{a-1}$–1.

According to this constitution, it is possible to generate the first signal to $2^{a-1}$th signal each having information of one bit per symbol from a received signal having information amounts a per symbol, rotate the phase of each of the first signal to $2^{a-1}$th signal by $(\pi/2^a+(S-1)\pi/2^{a-1})$, make a soft decision on whether each of the phase-rotated first signal to $2^{a-1}$th signal belongs to a symbol in a range of S–2 to S–$2+2^{a-1}$–1, and determine a soft decision value of each bit from the first provisional soft decision value to $2^{a-1}$th provisional soft decision value. It is thus possible to prevent exponential increases in equalizing processing amount with increases in information amount per symbol, while improving bit error rate characteristics.

An M-ary-modulation-capable equalizing processing apparatus according to a second feature of the Embodiments of the invention adopts a constitution where the soft-decision value determiner is provided with a symbol likelihood calculator that calculates likelihoods of symbols on the first provisional soft decision value to $2^{a-1}$th provisional soft decision value respectively output from the first equalizing processing section to $2^{a-1}$th equalizing processing section, a maximum likelihood symbol determiner which obtains the maximum value of the likelihoods of symbols and determines a symbol having a likelihood of the maximum value, and a bit likelihood calculator which decomposes the symbol with the likelihood of the maximum value into bits, and assigns the same likelihood to each decomposed bit.

According to this constitution, it is possible to decompose a symbol with the likelihood of the maximum value into bits and assign the same likelihood to each decomposed bit, and it is thus possible to decrease processing amounts to determine the soft decision value.

An M-ary-modulation-capable equalizing processing apparatus according to a third feature of the Embodiments of the invention adopts a constitution where the soft-decision value determiner is provided with a symbol likelihood calculator that calculates a likelihood of each symbol on the first provisional soft decision value to $2^{a-1}$th provisional soft decision value respectively output from the first equalizing processing section to $2^{a-1}$th equalizing processing section, a bit likelihood calculator that calculates a likelihood of each bit of a symbol output from the symbol likelihood calculator, and a soft-decision value output that outputs in the order of 0th bit to a–1th bit outputs of the bit likelihood calculator.

According to this constitution, it is possible to calculate the bit likelihood from results of calculation of symbol likelihood, and it is thereby possible to improve accuracy in determination on soft decision value An M-ary-modulation-capable equalizing processing apparatus according to a fourth feature of the Embodiments of the invention adopts a constitution provided with a received signal storage which stores a received signal that has a plurality of information amounts a per symbol and that is converted into a digital baseband signal, and divides the stored received signal into a first signal to $2^{a-1}$th signal each having information of one bit per symbol to read sequentially based on a read control signal, a phase rotator that rotates a phase of each of the first signal to $2^{a-1}$th signal sequentially based on a phase rotation angle signal, an equalizing processor which performs equalizing processing based on the Viterbi equalizing algorithm sequentially based on each of phase-rotated first signal to $2^{a-1}$th signal, a channel impulse response signal and an equalizing processing control signal, and outputs a first provisional soft decision value to $2^{a-1}$th provisional soft decision value, first provisional soft decision value storage to $2^{a-1}$th provisional soft decision value storage which respectively store the first provisional soft decision value to $2^{a-1}$th provisional soft decision value based on a storage control signal, a soft-decision value determiner that makes a soft decision on whether each of the first provisional soft decision value to $2^{a-1}$th provisional soft decision value belongs to a symbol in a range of S–2 to S–$2+2^{a-1}$–1 based on a soft-decision value determination control signal, and a controller which outputs the read control signal, phase rotation angle signal, the equalizing processing control signal, the storage control signal and the soft-decision value determination control signal.

According to this constitution, in addition to effects and advantages obtained by the M-ary-modulation-capable equalizing processing apparatus according to the first feature, the first signal to $2^{a-1}$th signal are sequentially read from the received signal storage based on the read control signal from controller, a single phase rotator rotates the phase of each of the first signal to $2^{a-1}$th signal, a single equalizing processor performs the equalizing processing repeatedly $2^{a-1}$ times on the phase-rotated first signal to $2^{a-1}$th signal, and it is thereby possible to reduce circuit scales of the phase rotator and equalizing processor.

An M-ary-modulation-capable equalizing processing apparatus according to a fifth feature of the invention adopts a constitution where a modulation system selection signal is input to the controller, and based on the modulation system selection signal, the controller controls the output of the phase rotation angle signal to the phase rotator and the output of the number of equalizing processing times to the equalizing processor.

According to this constitution, it is possible to easily achieve equalizing processing corresponding to a plurality of types of M-ary modulation schemes in the same apparatus, based on a modulation system selection signal input to the controller.

An M-ary-modulation-capable equalizing processing apparatus according to a sixth feature of the Embodiments of the invention adopts a constitution provided with first phase rotator to $2^{a-1}$th phase rotator which receive a received signal that has a plurality of information amounts a per symbol and that is converted into a digital baseband signal as a first signal to $2^{a-1}$th signal each having information of one bit per symbol, and respectively rotate phases of the first signal to $2^{a-1}$th signal by $(\pi/2^a+(S-1)\pi/2^{a-1})$ based on a phase rotation angle signal, first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively, a soft-decision value determiner that makes a soft decision on whether each of the first provisional soft decision value to $2^{a-1}$th provisional soft decision value belongs to a symbol in a range of S−2 to S−2+$2^{a-1}$−1 based on a soft-decision value determination control signal, and a controller which outputs the phase rotation angle signal, the equalizing processing control signal, and the soft-decision value determination control signal.

According to this constitution, in addition to effects and advantages obtained by the M-ary-modulation-capable equalizing processing apparatus according to the first feature, respective phase rotations of the first signal to $2^{a-1}$th signal can be carried out in parallel respectively in the first phase rotator to $2^{a-1}$th phase rotator, and equalizing processing of the phase-rotated first signal to $2^{a-1}$th signal Sr4 can be carried out in parallel respectively in the first equalizing processor to $2^{a-1}$th equalizing processor, whereby it is possible to achieve the equalizing processing of a signal having information of a bits per symbol in a short processing time of the same extent as the phase rotation and equalizing processing of a signal having information of "1" bit per symbol.

An M-ary-modulation-capable equalizing processing apparatus according to a seventh feature of the invention adopts a constitution where a modulation system selection signal is input to the controller, and based on the modulation system selection signal, the controller controls the output of the phase rotation angle signal to the phase rotator, the output of the number of equalizing processing times to the equalizing processor, and the output of the soft-decision value determination control signal to the soft-decision value determining section.

According to this constitution, it is possible to easily achieve equalizing processing corresponding to a plurality of types of M-ary modulation schemes in the same apparatus, based on a modulation system selection signal input to the controller.

A received signal processing system according to an eighth feature of the Embodiments of the invention adopts a constitution provided with an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with a signal divider that divides a received signal that has a plurality of information amounts a per symbol and that is converted into a digital baseband signal into a first signal to $2^{a-1}$th signal each having information of one bit per symbol, first phase rotator to $2^{a-1}$th phase rotator which respectively rotate phases of the first signal to $2^{a-1}$th signal by $(\pi/2^a+(S(S=1\sim 2^{a-1})-1)\pi/2^{a-1})$, first equalizing processor to $2^{a-1}$th equalizing processor which perform equalizing processing based on the Viterbi equalizing algorithm based on phase-rotated first signal to $2^{a-1}$th signal and a channel impulse response signal, and output a first provisional soft decision value to $2^{a-1}$th provisional soft decision value, respectively, and a soft-decision value determiner that makes a soft decision on whether each of the first provisional soft decision value to $2^{a-1}$th provisional soft decision value belongs to a symbol in a range of S−2 to S−2+$2^{a-1}$−1.

According to this constitution, in addition to effects and advantages obtained by the M-ary-modulation-capable equalizing processing apparatus according to the first feature, it is possible to achieve a received signal processing system capable of reducing processing amounts of the received signal and increasing the communication time and waiting time.

A received signal processing system according to a ninth feature of the Embodiments of the invention adopts a constitution provided with an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with a received signal storage which stores a received signal that has a plurality of information amounts a per symbol and that is converted into a digital baseband signal, and divides the stored received signal into a first signal to $2^{a-1}$th signal each having information of one bit per symbol to read sequentially based on a read control signal, a phase rotator which rotates a phase of each of the first signal to $2^{a-1}$th signal based on a phase rotation angle signal, an equalizing processor which performs equalizing processing based on the Viterbi equalizing algorithm based on each of phase-rotated first signal to $2^{a-1}$th signal, a channel impulse response signal and an equalizing processing control signal, and outputs a first provisional soft decision value to $2^{a-1}$th provisional soft decision value, first provisional soft decision value storage to $2^{a-1}$th provisional soft decision value storage which respectively store the first provisional soft decision value to $2^{a-1}$th provisional soft decision value based on a storage control signal, a soft-decision value determiner that makes a soft decision on whether each of the first provisional soft decision value to $2^{a-1}$th provisional soft decision value belongs to a symbol in a range of S−2 to S−2+$2^{a-1}$−1 based on a soft-decision value determination control signal, and a controller which outputs the read control signal, the phase rotation angle signal, the equalizing processing control signal, the storage control signal and the soft-decision value determination control signal.

According to this constitution, in addition to effects and advantages obtained by the M-ary-modulation-capable equalizing processing apparatus according to the fourth feature, it is possible to achieve a received signal processing system capable of reducing processing amounts of the received signal and increasing the communication time and waiting time.

A received signal processing system according to a tenth feature of the Embodiments of the invention adopts a constitution provided with an RF section that downcoverts a high-frequency received signal into an analog baseband signal, an analog/digital converter that converts the analog baseband signal into a digital baseband signal, an M-ary-modulation-capable equalizing processing apparatus that performs equalizing on the digital baseband signal to output a soft decision value, a channel codec section that performs error detection and error correction on the soft-decision value to output decoded data, and a speech codec section that converts the decoded data into speech data, where the M-ary-modulation-capable equalizing processing apparatus is provided with first phase rotator to $2^{a-1}$th phase rotator which receive a received signal that has a plurality of information amounts a per symbol and that is converted into a digital baseband signal as a first signal to $2^{a-1}$th signal each having information of one bit per symbol, and respectively rotate phases of the first signal to $2^{a-1}$th signal by $(\pi/2^a+(S-1)/2^{a-1})$ based on a phase rotation angle signal, first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively, a soft-decision value determiner that makes a soft decision on whether each of the first provisional soft decision value to $2^{a-1}$th provisional soft decision value belongs to a symbol in a range of S−2 to S−2+$2^{a-1}$−1 based on a soft-decision value determination control signal, and a controller which outputs the phase rotation angle signal, the equalizing processing control signal, and the soft-decision value determination control signal.

According to this constitution, in addition to effects and advantages obtained by the M-ary-modulation-capable equalizing processing apparatus according to the sixth feature, it is possible to achieve a received signal processing system capable of reducing processing amounts of the received signal and increasing the communication time and waiting time.

A receiver according to an eleventh feature of the Embodiments of the invention adopts a constitution having the received signal processing system and further having a reception antenna that receives the high-frequency received signal and a speaker that outputs speech based on speech data from the speech codec section.

According to this constitution, in the same way as in effects and advantages obtained by the received signal processing system according to either of eighth to tenth features, it is possible to achieve a receiver capable of reducing processing amounts of the received signal and increasing the communication time and waiting time.

An M-ary-modulation-capable equalizing processing method according to a twelfth feature of the Embodiments of the invention adopts a constitution provided with the steps of dividing a received signal that has a plurality of information amounts a per symbol and that is converted into a digital baseband signal into a first signal to $2^{a-1}$th signal each having information of one bit per symbol, rotating each of phases of the first signal to $2^{a-1}$th signal by $(\pi/2^a+(S-1)\pi/2^{a-1})$, performing equalizing processing based on the Viterbi equalizing algorithm based on each of phase-rotated first signal to $2^{a-1}$th signal and a channel impulse response signal and generating a first provisional soft decision value to $2^{a-1}$th provisional soft decision value, and making a soft decision on whether each of the first provisional soft decision value to $2^{a-1}$th provisional soft decision value belongs to a symbol in a range of S−2 to S−2+$2^{a-1}$−1.

According to this method, it is possible to generate the first signal to $2^{a-1}$th signal each having information of one bit per symbol from a received signal having information amounts a per symbol, rotate phases of the first signal to $2^{a-1}$th signal by $(\pi/2^a+(S-1)\pi/2^{a-1})$, make a soft decision on whether each of the phase-rotated first signal to $2^{a-1}$th signal belongs to a symbol in a range of S−2 to S−2+$2^{a-1}$−1, and determine a soft decision value of each bit from the first provisional soft decision value to $2^{a-1}$th provisional soft decision value.

Accordingly, the M-ary-modulation-capable equalizing processing apparatus, received signal processing system, receiver and M-ary-modulation-capable equalizing processing method have advantages of enabling reduction in processing amount of the equalizing processing while improving bit error rate characteristics, and are effective in the M-ary-modulation-capable equalizing processing apparatus, received signal processing system, receiver and M-ary-modulation-capable equalizing processing method of radio apparatuses and the like, without being limited to cellular telephones as mobile communication terminals.

The present invention is not limited to the above described embodiments, and various variations and modifications may be possible without departing from the scope of the present invention.

This application is based on the Japanese Patent Application No. 2004-157751 filed on Oct. 15, 2004, entire content of which is expressly incorporated by reference herein.

What is claimed is:

1. An M-ary-modulation-capable equalizing processing apparatus comprising:
    a signal divider that divides a received signal that has a plurality of information amounts a (a is a natural number) per symbol and that is converted into a digital baseband signal into a first signal to $2^{a-1}$th signal each having information of one bit per symbol;
    first phase rotator to $2^{a-1}$th phase rotator which respectively rotate phases of the first signal to $2^{a-1}$th signal by $(\pi/2^a+(S(S=1\sim2^{a-1})-1)\pi/2^{a-1})$;
    first equalizing processor to $2^{a-1}$th equalizing processor which perform equalizing processing based on the Viterbi equalizing algorithm based on phase-rotated first signal to $2^{a-1}$th signal and a channel impulse response signal, and output a first provisional soft decision value to $2^{a-1}$th provisional soft decision value, respectively; and
    a soft-decision value determiner that makes a soft decision on whether each of the first provisional soft decision value to $2^{a-1}$th provisional soft decision value belongs to a symbol in a range of S−2 to S−2+$2^{a-1}$−1.

2. The M-ary-modulation-capable equalizing processing apparatus according to claim 1, wherein the soft-decision value determiner comprises a symbol likelihood calculator that calculates likelihoods of symbols on the first provisional soft decision value to $2^{a-1}$th provisional soft decision value respectively output from the first equalizing processing section to $2^{a-1}$th equalizing processing section, a maximum likelihood symbol determiner which obtains a maximum value of the likelihoods of symbols and determines a symbol having a likelihood of the maximum value, and a bit likelihood calculator which decomposes the symbol with the likelihood of the maximum value into bits, and assigns the same likelihood to each decomposed bit.

3. The M-ary-modulation-capable equalizing processing apparatus according to claim 1, wherein the soft-decision value determiner comprises a symbol likelihood calculator that calculates a likelihood of each symbol on the first provisional soft decision value to $2^{a-1}$th provisional soft decision value respectively output from the first equalizing processing section to $2^{a-1}$th equalizing processing section, a bit likelihood calculator that calculates a likelihood of each bit of a symbol output from the symbol likelihood calculator, and a soft-decision value output that outputs in the order of 0th bit to a−1th bit outputs of the bit likelihood calculator.

4. An M-ary-modulation-capable equalizing processing apparatus comprising:
a received signal storage which stores a received signal that has a plurality of information amounts a per symbol and that is converted into a digital baseband signal, and divides the stored received signal into a first signal to $2^{a-1}$th signal each having information of one bit per symbol to read sequentially based on a read control signal;
a phase rotator that rotates a phase of each of the first signal to $2^{a-1}$th signal based on a phase rotation angle signal;
an equalizing processor which performs equalizing processing based on the Viterbi equalizing algorithm sequentially based on each of phase-rotated first signal to $2^{a-1}$th signal, a channel impulse response signal and an equalizing processing control signal, and outputs first provisional soft decision value to $2^{a-1}$th provisional soft decision value;
first provisional soft decision value storage to $2^{a-1}$th provisional soft decision value storage which respectively store the first provisional soft decision value to $2^{a-1}$th provisional soft decision value based on a storage control signal;
a soft-decision value determiner that makes a soft decision on whether each of the first provisional soft decision value to $2^{a-1}$th provisional soft decision value belongs to a symbol in a range of $S(S=1\sim 2^{a-1})-2$ to $S-2+2^{a-1}-1$ based on a soft-decision value determination control signal; and
a controller which outputs the read control signal, the phase rotation angle signal, the equalizing processing control signal, the storage control signal and the soft-decision value determination control signal.

5. The M-ary-modulation-capable equalizing processing apparatus according to claim 4, wherein a modulation system selection signal is input to the controller, and based on the modulation system selection signal, the controller controls output of the phase rotation angle signal to the phase rotator and output of the number of equalizing processing times to the equalizing processor.

6. An M-ary-modulation-capable equalizing processing apparatus comprising:
first phase rotator to $2^{a-1}$th phase rotator which receive a received signal that has a plurality of information amounts a (a is a natural number) per symbol and that is converted into a digital baseband signal as a first signal to $2^{a-1}$th signal each having information of one bit per symbol, and respectively rotate phases of the first signal to $2^{a-1}$th signal by $(\pi/2^{a}+(S(S=1\sim 2^{a-1})-1)\pi/2^{a-1})$ based on a phase rotation angle signal;
first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively;
a soft-decision value determiner that makes a soft decision on whether each of the first provisional soft decision value to $2^{a-1}$th provisional soft decision value belongs to a symbol in a range of $S-2$ to $S-2+2^{a-1}-1$ based on a soft-decision value determination control signal; and
a controller which outputs the phase rotation angle signal, the equalizing processing control signal, and the soft-decision value determination control signal.

7. The M-ary-modulation-capable equalizing processing apparatus according to claim 6, wherein a modulation system selection signal is input to the controller, and based on the modulation system selection signal, the controller controls output of the phase rotation angle signal to phase rotator, output of the number of equalizing processing times to the equalizing processor, and output of the soft-decision value determination control signal to the soft-decision value determiner.

8. A received signal processing system comprising:
an RF section that downcoverts a high-frequency received signal into an analog baseband signal;
an analog/digital converter that converts the analog baseband signal into a digital baseband signal;
an M-ary-modulation-capable equalizing processing apparatus that performs equalizing on the digital baseband signal to output a soft decision value;
a channel codec section that performs error detection and error correction on the soft-decision value to output decoded data; and
a speech codec section that converts the decoded data into speech data,
wherein the M-ary-modulation-capable equalizing processing apparatus comprises a signal divider that divides a received signal that has a plurality of information amounts a (a is a natural number) per symbol and that is converted into a digital baseband signal into a first signal to $2^{a-1}$th signal each having information of one bit per symbol,
first phase rotator to $2^{a-1}$th phase rotator which respectively rotate phases of the first signal to $2^{a-1}$th signal by $(\pi/2^{a}+(S(S=1\sim 2^{a-1})-1)\pi/2^{a-1})$,
first equalizing processor to $2^{a-1}$th equalizing processor which perform equalizing processing based on the Viterbi equalizing algorithm based on phase-rotated first signal to $2^{a-1}$th signal and a channel impulse response signal, and output a first provisional soft decision value to $2^{a-1}$th provisional soft decision value, respectively; and
a soft-decision value determiner that makes a soft decision on whether each of the first provisional soft decision value to $2^{a-1}$th provisional soft decision value belongs to a symbol in a range of $S-2$ to $S-2+2^{a-1}-1$.

9. A receiver comprising:
the received signal processing system according to claims 8;
a reception antenna that receives the high-frequency received signal; and
a speaker that outputs speech based on speech data from the speech codec section.

10. A received signal processing system comprising:
an RF section that downcoverts a high-frequency received signal into an analog baseband signal;
an analog/digital converter that converts the analog baseband signal into a digital baseband signal;
an M-ary-modulation-capable equalizing processing apparatus that performs equalizing on the digital baseband signal to output a soft decision value;
a channel codec section that performs error detection and error correction on the soft-decision value to output decoded data; and
a speech codec section that converts the decoded data into speech data, wherein the M-ary-modulation-capable equalizing processing apparatus comprises a received signal storage which stores a received signal that has a plurality of information amounts a (a is a natural number) per symbol and that is converted into a digital baseband signal, and divides the stored received signal into a first signal to $2^{a-1}$th signal each having information of one bit per symbol to read sequentially based on a read control signal, a phase rotator which rotates a phase of each of the first signal to $2^{a-1}$th signal based on a phase rotation angle signal, an equalizing processor which performs equalizing processing based on the Viterbi equalizing algorithm based on each of phase-rotated first signal to $2^{a-1}$th signal, a channel impulse response signal and an equalizing processing control signal, and outputs first provisional soft decision value to $2^{a-1}$th provisional soft decision value, first provisional soft decision value storage to $2^{a-1}$th provisional soft decision value storage which respectively store the first provisional soft decision value to $2^{a-1}$th provisional soft decision value based on a storage control signal, a soft-decision value determiner that makes a soft decision on whether each of the first provisional soft decision value to $2^{a-1}$th provisional soft decision value belongs to a symbol in a range of S–2 to S–2+$2^{a-1}$–1 based on a soft-decision value determination control signal, and a controller which outputs the read control signal, the phase rotation angle signal, the equalizing processing control signal, the storage control signal and the soft-decision value determination control signal.

11. A received signal processing system comprising:
an RF section that downcoverts a high-frequency received signal into an analog baseband signal,
an analog/digital converter that converts the analog baseband signal into a digital baseband signal,
an M-ary-modulation-capable equalizing processing apparatus that performs equalizing on the digital baseband signal to output a soft decision value,
a channel codec section that performs error detection and error correction on the soft-decision value to output decoded data, and
a speech codec section that converts the decoded data into speech data, wherein the M-ary-modulation-capable equalizing processing apparatus comprises first phase rotator to $2^{a-1}$th phase rotator which receive a received signal that has a plurality of information amounts a (a is a natural number) per symbol and that is converted into a digital baseband signal as a first signal to $2^{a-1}$th signal each having information of one bit per symbol, and respectively rotate phases of the first signal to $2^{a-1}$th signal by $(\pi/2^a+(S(S=1\sim2^{a-1})-1)\pi/2^{a-1})$ based on a phase rotation angle signal, first equalizing processor to $2^{a-1}$th equalizing processor which perform equalizing processing based on the Viterbi equalizing algorithm based on phase-rotated first signal to $2^{a-1}$th signal, a channel impulse response signal and an equalizing processing control signal, and output a first provisional soft decision value to $2^{a-1}$th provisional soft decision value, respectively, a soft-decision value determiner that makes a soft decision on whether each of the first provisional soft decision value to $2^{a-1}$th provisional soft decision value belongs to a symbol in a range of S–2 to S–2+$2^{a-1}$–1 based on a soft-decision value determination control signal, and a controller which outputs the phase rotation angle signal, the equalizing processing control signal, and the soft-decision value determination control signal.

12. An M-ary-modulation-capable equalizing processing method comprising the steps of:
dividing a received signal that has a plurality of information amounts a (a is a natural number) per symbol and that is converted into a digital baseband signal into a first signal to $2^{a-1}$th signal each having information of one bit per symbol;
rotating each of phases of the first signal to $2^{a-1}$th signal by $(\pi/2^a+(S(S=1\sim2^{a-1})-1)\pi/2^{a-1})$
performing equalizing processing based on the Viterbi equalizing algorithm based on phase-rotated first signal to $2^{a-1}$th signal and a channel impulse response signal, and generating a first provisional soft decision value to $2^{a-1}$th provisional soft decision value; and
making a soft decision on whether each of the first provisional soft decision value to $2^{a-1}$th provisional soft decision value belongs to a symbol in a range of S–2 to S–2+$2^{a-1}$–1.

* * * * *